United States Patent
Korec et al.

(10) Patent No.: US 8,692,324 B2
(45) Date of Patent: Apr. 8, 2014

(54) SEMICONDUCTOR DEVICES HAVING CHARGE BALANCED STRUCTURE

(75) Inventors: Jacek Korec, Sunrise, FL (US); Shuming Xu, Schnecksville, PA (US); Christopher Boguslaw Kocon, Mountain Top, PA (US)

(73) Assignee: Ciclon Semiconductor Device Corp., Bethlehem, PA (US)

( * ) Notice: Subject to any disclaimer, the term of this patent is extended or adjusted under 35 U.S.C. 154(b) by 650 days.

(21) Appl. No.: 12/139,984

(22) Filed: Jun. 16, 2008

(65) Prior Publication Data

US 2008/0246086 A1    Oct. 9, 2008

Related U.S. Application Data

(63) Continuation-in-part of application No. 11/676,613, filed on Feb. 20, 2007, now Pat. No. 7,589,378, which is a continuation-in-part of application No. 11/180,155, filed on Jul. 13, 2005, now Pat. No. 7,282,765.

(51) Int. Cl.
  *H01L 29/66* (2006.01)
  *H01L 29/78* (2006.01)
(52) U.S. Cl.
  USPC .... 257/343; 257/336; 257/493; 257/E29.007; 257/E29.121; 257/E29.256
(58) Field of Classification Search
  USPC ......... 257/155, 213, 328, 329, 336, 341–343, 257/384, 409, 488, 491–493, 257/E29.006–E29.01, E29.013, 257/E29.118–E29.121, E29.256–E29.258
  See application file for complete search history.

(56) References Cited

U.S. PATENT DOCUMENTS

| | | | |
|---|---|---|---|
| 4,455,565 A | 6/1984 | Goodman et al. | |
| 4,754,310 A | 6/1988 | Coe | |
| 5,155,563 A | 10/1992 | Davies et al. | |
| 5,216,275 A | 6/1993 | Chen | |
| 5,252,848 A | 10/1993 | Adler et al. | |
| 5,374,843 A * | 12/1994 | Williams et al. | 257/492 |

(Continued)

OTHER PUBLICATIONS

Cheon Soo Kim et al., Trenched Sinker LDMOSFET (TS-LDMOS) Structure for High Power Amplifier Application above 2 GHz, IEEE No. 0-7803-7050-3/01, 2001, pp. IEDM 01-887-IEDM 01-890.

(Continued)

*Primary Examiner* — Allison P Bernstein
(74) *Attorney, Agent, or Firm* — Alan A. R. Cooper; W. James Brady, III; Frederick J. Telecky, Jr.

(57) ABSTRACT

A laterally diffused metal-oxide-semiconductor transistor device includes a substrate having a first conductivity type with a semiconductor layer formed over the substrate. A source region and a drain extension region of the first conductivity type are formed in the semiconductor layer. A body region of a second conductivity type is formed in the semiconductor layer. A conductive gate is formed over a gate dielectric layer that is formed over a channel region. A drain contact electrically connects the drain extension region to the substrate and is laterally spaced from the channel region. The drain contact includes a highly-doped drain contact region formed between the substrate and the drain extension region in the semiconductor layer, wherein a topmost portion of the highly-doped drain contact region is spaced from the upper surface of the semiconductor layer. A source contact electrically connects the source region to the body region.

24 Claims, 20 Drawing Sheets

(56) References Cited

U.S. PATENT DOCUMENTS

| | | | |
|---|---|---|---|
| 5,841,166 A | 11/1998 | D'Anna et al. | |
| 5,907,173 A | 5/1999 | Kwon et al. | |
| 5,912,490 A | 6/1999 | Hebert et al. | |
| 5,949,104 A | 9/1999 | D'Anna et al. | |
| 6,001,710 A | 12/1999 | Francois et al. | |
| 6,063,678 A | 5/2000 | D'Anna | |
| 6,168,983 B1 * | 1/2001 | Rumennik et al. | 438/188 |
| 6,181,200 B1 | 1/2001 | Titizian | |
| 6,215,152 B1 | 4/2001 | Hebert | |
| 6,372,557 B1 | 4/2002 | Leong | |
| 6,509,220 B2 * | 1/2003 | Disney | 438/197 |
| 6,521,923 B1 | 2/2003 | D'Anna et al. | |
| 6,600,182 B2 | 7/2003 | Rumennik | |
| 6,653,740 B2 | 11/2003 | Kinzer et al. | |
| 6,677,641 B2 * | 1/2004 | Kocon | 257/329 |
| 6,720,618 B2 | 4/2004 | Kawaguchi et al. | |
| 6,831,332 B2 | 12/2004 | D'Anna et al. | |
| 6,956,239 B2 | 10/2005 | Sriram | |
| 7,126,193 B2 | 10/2006 | Baiocchi et al. | |
| 7,166,496 B1 | 1/2007 | Lopez et al. | |
| 7,235,845 B2 | 6/2007 | Xu et al. | |
| 7,282,765 B2 | 10/2007 | Xu et al. | |
| 2002/0017697 A1 | 2/2002 | Kitamura et al. | |
| 2004/0021233 A1 | 2/2004 | Kinzer et al. | |
| 2005/0017298 A1 | 1/2005 | Xie et al. | |
| 2007/0034942 A1 | 2/2007 | Xu et al. | |
| 2007/0040254 A1 | 2/2007 | Lopez et al. | |
| 2007/0085204 A1 | 4/2007 | Korec et al. | |
| 2007/0138548 A1 | 6/2007 | Kocon et al. | |
| 2007/0215939 A1 | 9/2007 | Xu et al. | |
| 2008/0036078 A1 | 2/2008 | Herbsommer et al. | |

OTHER PUBLICATIONS

Yasuhova, Matsushita et al., "Low Gate Charge 30 V N-channel LDMOS for DC-DC converters," International Symposium on Power Semiconductor Devices & ICS (15TH: 2003: Cambridge, England) (4 pages).

Xu, Baiocchi et al., "High Power Silicon RF LDMOSFET Technology for 2.1 GHZ Power Amplifier Applications," IEE Proceedings—Circuits Devices Syst. vol. 151, No. 3, Jun. 2004 pp (4 pages).

Xu, Shibib et al., "High Performance RF Power LDMOSFET Technology for 2.1 GHZ Power Amplifier Applications," Microwave Symposium Digest, 2003 IEEE MTT-S International Publication Date: Jun. 8-13, 2003 vol. 1, pp. 217-220.

\* cited by examiner

SEMICONDUCTOR DEVICES HAVING CHARGE BALANCED STRUCTURE

CROSS-REFERENCE TO RELATED APPLICATION

This application is a continuation-in-part of co-pending U.S. patent application Ser. No. 11/676,613 filed Feb. 20, 2007, which is a continuation-in-part of U.S. patent application Ser. No. 11/180,155 filed Jul. 13, 2005, now U.S. Pat. No. 7,282,765, the entirety of each of which is hereby incorporated by reference herein.

FIELD OF THE INVENTION

The present invention relates to semiconductor structures and more particularly to laterally diffused MOS transistors (LDMOS) and methods of making the same.

BACKGROUND OF THE INVENTION

Power MOSFETs (metal oxide semiconductor (MOS) field effect transistors (FET)) are used, for example, as electric switches for high frequency PWM (pulse width modulation) applications such as voltage regulators and/or as load switches in power applications. When used as load switches, where switching times are usually long, cost, size and on-resistance of the switches are the prevailing design considerations. When used in PWM applications, the transistors must exhibit small power loss during switching, which imposes an additional requirement—small internal capacitances—that make the MOSFET design challenging and often times more expensive. Special attention has been paid to the Gate-to-Drain (Cgd) capacitance, as this capacitance determines the voltage transient time during switching and is the most important parameter affecting the switching power loss.

Examples of prior art laterally diffused power MOSFET devices are provided in U.S. Pat. No. 5,949,104 to D'Anna et al. and U.S. Pat. No. 6,831,332 to D'Anna et al., the entirety of which are hereby incorporated by reference herein. Both devices use thick epitaxial layers to achieve the high breakdown voltage (>60V) required for the target RF applications. To minimize the parasitic source inductance in the assembly, both devices are designed on P+ substrates leading the source electrode to the back side of the die. The thick epitaxial layer and P+ substrate result in a high on resistance ($R_{ds,on}$) of the device, which is not acceptable for power management applications.

Another prior art LDMOS device is disclosed in U.S. Pat. No. 6,600,182 to Rumennik, entitled "High Current Field-Effect Transistor." The Rumennik device includes a drain region that has a first portion that extends vertically through the epitaxial layer to connect to the substrate and a second portion that extends laterally along the top surface of the device. The device has low specific on-resistance and supports high current flow. However, the breakdown voltage of the device is highly dependent on the location of the first portion of the drain region, which narrows the manufacturing tolerances for the device.

There remains a need for a LDMOS design that exhibits improved device performance ($R_{ds,on}$ and Cgd) with improved manufacturability.

SUMMARY OF THE INVENTION

An LDMOS device is provided comprising a substrate having a first conductivity type and a lightly doped epitaxial layer thereon having an upper surface. Source and drain regions of the first conductivity type are formed in the epitaxial layer proximate the upper surface, the source and drain regions being spaced from one another and having a channel region of a second conductivity type formed therebetween in the epitaxial layer, the channel region extending under the source region. A conductive gate is formed over a gate dielectric layer formed over the channel region and partially overlapping the source and drain regions. A drain contact electrically connects the drain region to the substrate and is spaced from the channel region, comprising a first trench formed from the upper surface of the epitaxial layer to the substrate and having a side wall along the epitaxial layer, a highly doped region of the first conductivity type formed along the side wall of the first trench, and a drain plug in the first trench adjacent the highly doped region. A source contact is electrically connected to the source region and provides an electrical short between the source region and the channel region. An insulating layer is formed between the conductive gate and the source contact.

In an alternative embodiment, the drain contact comprises a highly-doped drain contact region formed between the substrate and the drain extension region in the semiconductor layer, wherein a topmost portion of the highly-doped drain contact region is spaced from the upper surface of the semiconductor layer. A source contact electrically couples the source region to the body region.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

As used herein, the following dopant concentrations are distinguished using the following notations:

(a) N++ or P++: dopant concentration of about $>5\times10^{19}$ atoms/cm$^3$;

(b) N+ or P+: dopant concentration of about $1\times10^{18}$ to $5\times10^{19}$ atoms/cm$^3$;

(c) N or P: dopant concentration of about $5\times10^{16}$ to $1\times10^{18}$ atoms/cm$^3$;

(d) N- or P-: dopant concentration of about $1\times10^{15}$ to $5\times10^{16}$ atoms/cm$^3$; and (e) N-- or P--: dopant concentration of about $<1\times10^{15}$ atoms/cm$^3$.

In the following description, numerous specific details are set forth, such as material types, doping levels, structural features, processing steps, etc., in order to provide a thorough understanding of the present invention. Those of ordinary skill in the art will understand that the invention described herein may be practiced without many of these details. In other instances, well-known elements, techniques, features, and processing steps have not been described in detail in order to avoid obscuring the invention.

It should also be understood that the elements in the figures are representational and are not drawn to scale in the interest of clarity. It is also appreciated that a p-channel transistor may be realized by utilizing the opposite conductivity types for all of the illustrated diffusion/doped regions.

Figure 1:
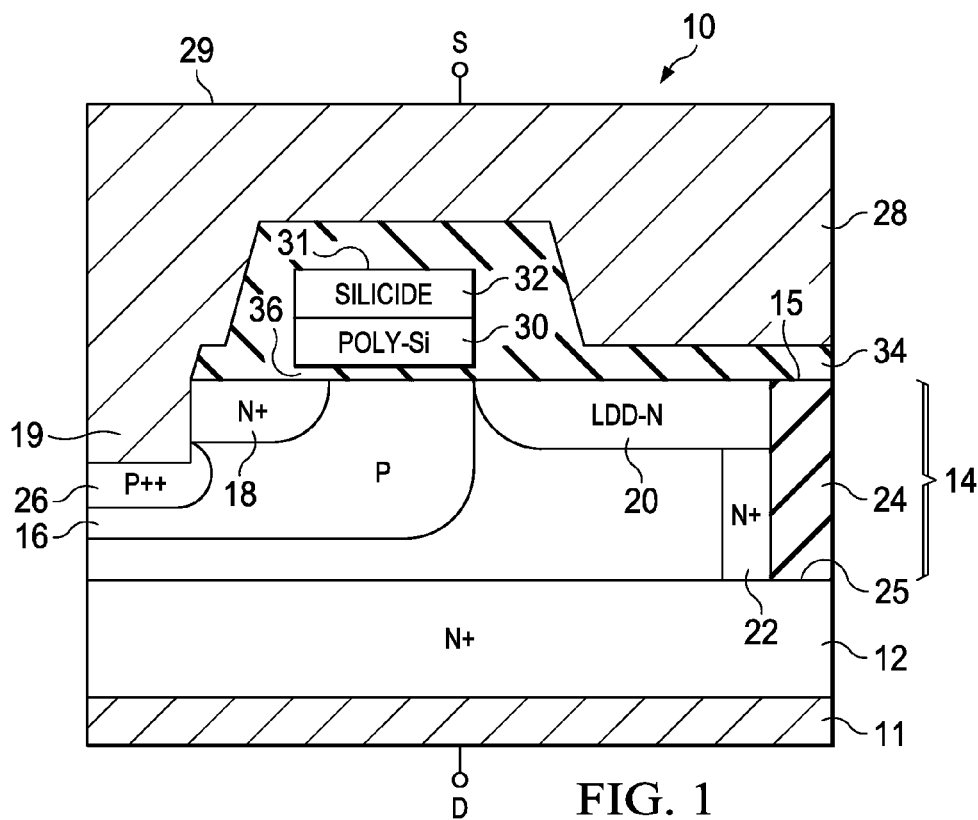
FIG. 1 is an illustration of a LDMOS transistor according to the present invention.

FIG. 1 is an illustration of an embodiment of an improved power transistor, more specifically an improved LDMOS transistor 10. In exemplary applications, the transistor 10 is used as a switch in a voltage regulator of a power supply for, for example, a server or desktop computer or in a DC/DC converter for general use.

More specifically, FIG. 1 shows an improved n-channel LDMOS device. The transistor structure 10 includes a semiconductor substrate 12, which, in the illustrated embodiment, is preferably a highly doped (N+) silicon wafer doped with arsenic or phosphorous, for example. Highly doped (N+) substrates have lower resistances than P+ substrates, although in alternative embodiments, the substrate 12 may be P+ doped. In embodiments, a drain electrode 11 is formed along the bottom of the substrate 12 and is electrically connected to the N+ substrate 12. Metallization of the bottom surface of the substrate 12 in this manner facilitates future connection with a package electrode (not shown). In an exemplary embodiment, substrate 12 has a thickness of less than or equal to about 3 mils (76.2 μm), thereby providing a very low resistance contact to the drain electrode and minimizing the contribution of the substrate to the on-resistance of the transistor. The substrate can be grinded, and/or etched, or otherwise formed to this desired thickness. Such processes would typically be done toward the end of the processing of the substrate wafer.

A lightly doped silicon epitaxial layer 14 is formed over the substrate 12 and has an upper surface 15. In certain embodiments, the epitaxial layer 14 can have dopants of N (arsenic or phosphorous) or P (boron) dopant type and a dopant concentration of N-, N--, P- or P--. In one embodiment, the epitaxial layer has a thickness between about 1.5 to 3.5 μm.

The doping of the epitaxial layer is usually much lower than the doping concentration of the implanted source/drain regions. On the other hand, in case of devices with vertical current flow, the background doping of the epitaxial layer is preferably as high as possible in order to reduce the on resistance between the drain and source (Rds,on) while being just low enough to meet the targeted breakdown voltage of the transistor. With the present device, however, the original doping of the epitaxial layer has no effect on the resistance of the device because current flows through the vertical drain contact region 22, and the doping concentration can be kept very low, below $2\times10^{16}$ atoms/cm$^3$, and more preferably at or below $8\times10^{15}$ atoms/cm$^3$, for example.

A conductive gate 31 overlies the upper surface 15 of the epitaxial layer 14. In the embodiment illustrated in FIG. 1, the conductive gate 31 comprises a lower doped polysilicon layer 30 with an upper silicide layer 32 formed therein or thereover by processes familiar to those in the art. Silicide layer 32 can comprise any transition metal silicide, and in exemplary embodiments is selected from the group consisting of Ti, W and Co. The conductive gate preferably has a thickness between about 0.3 to 0.6 μm and a length defined by the technology generation utilized in its fabrication, e.g., 0.8 μm, 0.5 μm, 0.35 μm or 0.25 μm, etc. The conductive gate 31 is formed over a gate dielectric 36, which preferably comprises SiO$_2$ formed to a thickness between about 150 to 500 Å.

Drain region 20 is formed completely within epitaxial layer 14 and forms an enhanced drain drift region. The enhanced drain drift region 20 is formed abutting or at least proximate to the upper surface 15 of epitaxial layer 14 and has a dopant concentration N in the illustrated embodiment. The enhanced drain drift region 20 increases the drain-to-source breakdown voltage of the LDMOS structure 10. Drain drift region 20 has a lateral dimension between about 0.5 to 1.5 μm, and a depth of between about 0.2 to 0.4 μm. The region 20 preferably extends below (i.e., is overlapped by) the conductive gate between about 0.05 to 0.15 μm and is known as lightly doped drain (LDD) structure in the literature, such as U.S. Pat. No. 5,907,173 to Kwon et al., the entirety of which is hereby incorporated by reference herein.

The LDMOS structure 10 also includes a source implant region 18 having a conductivity N+ spaced from the enhanced drain drift region 20. Source region 18 extends laterally between about 0.5 to 0.8 μm, has a depth between about 0.15 to 0.3 μm and also partially underlies the conductive gate between about 0.05 to 0.15 μm. A body region 16 having P-type dopants and having a conductivity of P concentration is formed in epitaxial layer 14 and has a subregion between the source 18 and enhanced drain region 20, forming a channel region therebetween. The body region 16 includes body contact region 26. In exemplary embodiments, the body region 16 is formed to a depth of between about 0.5 to 1.0 μm and horizontal length between about 0.8 to 1.5 μm.

The body contact region 26 has a dopant concentration P++ greater than the concentration of the body region 16. In one embodiment, the body contact region 26 is formed at the base of a shallow trench region 19 and has a lateral dimension between about 0.1 to 0.3 μm and is formed to a depth between about 0.1 to 0.3 μm. The body contact region 26 provides for a low resistance contact between the source metal layer 28 (described in more detail below) and the body region 16. Under blocking condition where the voltage applied to the drain electrode results in a reverse bias of the body-to-drain PN-junction, the depletion layer or region is "squeezed" in the vertical direction between the contact implant 26 and the doping gradient from the substrate 12. The reduced width of the depletion layer results in a lower source-drain breakdown voltage but localizes the place where the breakdown occurs beneath the contact implant. This, in turn, defines the path for the current generated during the avalanche condition, i.e., when the electric field at the body-to-drain PN-junction is so high that it leads to a generation of minority carriers by impact ionization.

A deep trench region 25 (shown filled with a plug 24) is formed adjacent enhanced drain drift region 20 and spaced from the conductive gate 31. The trench 25 is formed from the upper surface 15 of the epitaxial layer 14 to the upper surface of the substrate 12. The trench 25 enables the formation of vertical drain contact region 22 adjacent the sidewalls of trench region 25, which provides a low resistance path between the enhanced drain drift region 20 and substrate 12, and thus to the drain electrode 11. In the n-channel embodiment shown in FIG. 1, the drain contact 22 has a dopant concentration N+ or higher and is formed by low angle implantation while trench 25 is open. Trench 25 is then filled with a conductive material (e.g., tungsten or doped polysilicon) or insulative material (e.g., $Si_xO_y$) to form plug 24. In one embodiment, drain contact 22 has a horizontal dimension into epitaxial layer 14 in the amount of about 0.4 to 0.8 μm. In other embodiments, the epitaxial layer is very thin (e.g., 1.5 μm) and there is no need to etch the trench in order to form drain contact implant 22. In this embodiment, the drain contact 22 is created by a diffused region(s) of first conductivity type, created by multiple implants and extending from the surface to the substrate. There is no need for a drain plug in this embodiment, as no deep trench 25 is formed.

The device 10 also includes an insulating layer 34 formed over the upper surface 15 of the epitaxial layer, and thus over source implant region 18, over the sidewalls of the conductive gate 31 and its upper surface, as well as over the enhanced drain drift region 20 and contact plug 24. The insulating layer 34 preferably comprises $SiO_2$ or $SiO_xN_y$. It should be understood, however, that insulating layer 34 can comprise several layers of insulating materials collectively forming the insulating layer 34. Insulating layer 34 is preferably formed to a thickness of at least 0.03 μm on the sidewalls of the conductive gate 31 and at least 0.05 μm on the top surface of the conductive gate 31. In an exemplary embodiment, insulating layer 34 is formed to a thickness between about 0.05-0.15 μm over the drain region 20. The insulating layer insulates the drain region 20 and gate 31 from the source metal layer 28, described below.

As is shown in FIG. 1, device 10 also includes a source metal layer 28, which preferably comprises conductive material selected from the group consisting of Al, Ti/Al, Ti/TiN/Al or W blanket deposited over the device such as by CVD (chemical vapor deposition) or by sputtering. The source metal layer 28 is deposited to fill shallow trench 19 to provide a contact between a source electrode and the source implant 18 as well as provide a short between the source and body regions 18, 16. Source metal layer 28 extends over insulation layer 34, over the conductive gate 31 and over the drain implant region 20 and drain plug 24. In one embodiment, the source metal layer 28 has a thickness defined between the upper surface 15 of the epitaxial layer 14 and its upper surface 29 between about 1.0 to 5.0 μm.

When the LDMOS transistor device 10 is turned "on," the conduction current flows through the source metal 28, laterally through the channel underneath the gate 31 to the drain region 20 and then vertically along the vertical, highly doped drain contact 22 though the substrate 12 to the drain electrode 11 placed at the bottom side of the device 10.

The source metal structure 28 of FIG. 1 provides several advantages. First, a single layer of metal can serve as a source contact and a shield electrode, which shields the conductive gate from the drain contact 22 and reduces the capacitance between the gate and drain (Cgd). There is no need to form a separate shield gate nor is there a need to separately connect the shield gate to the source. The manufacturability of the device is thereby greatly improved.

Further, the drain-source resistance (Rsd) is optimized by the use of an N+ substrate. As those in the art will recognize, n-channel devices designed for RF applications are typically formed on P+ substrates because it is important to have the source electrode at ground potential at the bottom of the die. Although n-channel devices may be preferred for their lower channel resistance compared to p-channel devices, the p-doped substrates of the prior art provide much higher resistances than n-substrates, often 2 to 3 times higher. The present device 10, however, provides an n-channel device on a low resistance n-doped substrate.

An exemplary method of forming device 10 is now described. Certain details which will be readily apparent to those in the art are eliminated so as to avoid obscuring the present invention. Substrate 12 is provided with a pre-defined N+ dopant concentration. Epitaxial layer 14 having dopant concentration of N− or P− is next formed over the upper surface of the substrate 12. A first trench is etched through the epitaxial layer after depositing and patterning of a thin oxide layer used as a dedicated drain contact mask. The side walls of the trench are N+ doped with a 7 degree implant of a suitable dopant, preferably Phosphorous or Arsenic, to form the drain contact regions. The first trench is filled with a material to form the drain plug. In one embodiment, the trench is filled with N+ doped polysilicon. Next, the polysilicon is etched back to a level slightly below the surface of the epitaxial layer and the oxide mask is removed.

After forming the drain contact and plug regions in the epitaxial layer 14, a thin gate oxide layer is formed over the upper surface 15 of the epitaxial layer. Next, a layer of polysilicon is deposited and etched to form a polysilicon gate. Silicide layer 32 is then formed using the well know salicide process or a silicide layer is deposited over the polysilicon layer and etched therewith to form the stacked polysilicon/silicide structure shown in FIG. 1. Following the formation of silicide layer 32, P-body or N-enhanced drift regions are formed by masked implantation of respective dopants and thermal diffusion steps. The side spacers adjacent the conductive gate can be separately formed using a known side wall spacer process if necessary. For example, an oxide layer can be deposited and etched back with an anisotropic reactive ion etch (RIE). The N+ source region is formed by implantation of Arsenic using a patterned photoresist as a mask.

An oxide layer 34 is deposited over the upper surface 15 and conductive gate 31 to the desired thickness. Next, shallow trench 19 is patterned and etched to the desired depth, followed by formation of implant region 26. Finally, a metal layer is deposited over the entire structure to form source metal layer 28. The original substrate is then thinned to a desired thickness and a backside metal layer 11 is deposited to from the drain electrode. The device is then packaged and tested.

Figure 2:
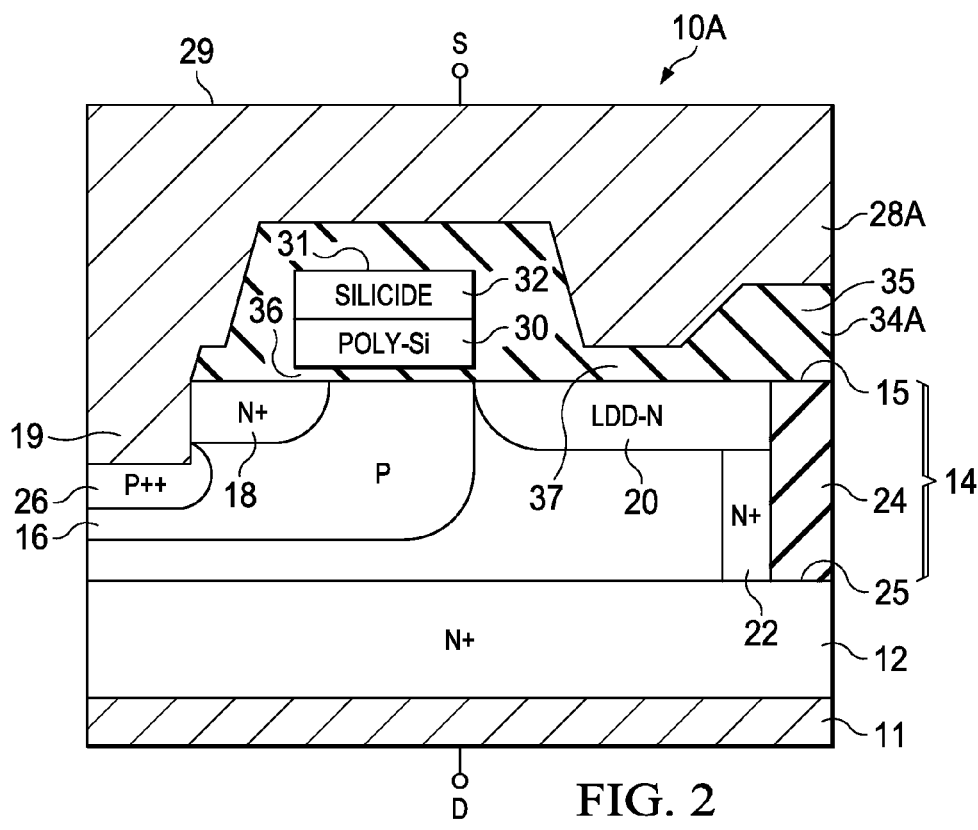
FIG. 2 is an illustration of an embodiment of a LDMOS transistor of the present invention having improved field plate effect.

FIG. 2 illustrates a second embodiment 10A of the improved LDMOS device. The device 10A is identical in all respects to the device 10 of FIG. 1, and like features are identified by like reference numbers, except for modified insulation layer 34A and modified source metal layer 28A. It should be understood that source metal layer 28A is modified only in so much as it is deposited over modified insulation layer 34A. In the regions proximate to the drain implant region 20 and drain plug 24, modified insulation layer 34A has two thicknesses. More specifically, modified insulation layer 34A has a thicker region designated generally at 35 formed over drain plug 24 and parts of drain region 20 and a thinner portion 37 formed over drain region 20 and between the thicker portion 35 and the gate 31. In one embodiment, the length of the thin oxide region 37 amounts to about ½ to ¾ of the distance between the gate 31 and the drain plug 24. In an exemplary embodiment, the thickness of thinner portion 37 is between about 0.05-0.15 μm and the thickness of the thicker portion 35 is between about 0.2-0.5 μm. The improved insulation layer 34A can be formed first by etching a thicker, oxide layer deposited after the formation of the drain plug region. The thin oxide region 37 is deposited after gate formation and its thickness is adds to the final thickness of the region 34A, including portion 35.

In the embodiment of FIG. 2, not only does the source metal layer 28A provide a contact to the source and body regions 18, 16 and a shield between the gate 31 and the drain contact 22, it provides for better optimization of the field plate effect. The thin oxide region 37 makes the field plate effect very effective at the gate corner by pushing the depletion layer away from the PN-junction between the body region 16 and the drain 20. If the thin oxide were to extend laterally to cover all of the drain region 20 and the drain plug 24, a high electric field peak would be located at the N–N+ drain contact corner. Making the oxide thicker at 35 relieves the electric field between the source metal and the drain contact region 22. The doping and the length of the drain region underneath the field plate, the position of the oxide step between regions 37 and 35 and the oxide thickness can be optimized for a given breakdown voltage target. As an example, the design of this portion of the transistor can be as follows for a target breakdown voltage of 20V:

total gate to drain plug distance 0.8-1.2 μm;
length of the thin oxide region 0.5-0.8 μm;
thickness of the thin oxide region 0.06-0.1 μm;
thickness of the thick oxide region 0.2-0.3 μm; and
the dose and the energy of the LDD implant $5 \times 10^{12}$ to $7 \times 10^{12}$ atoms/cm$^2$ and 80 to 150 keV.

Figure 3:
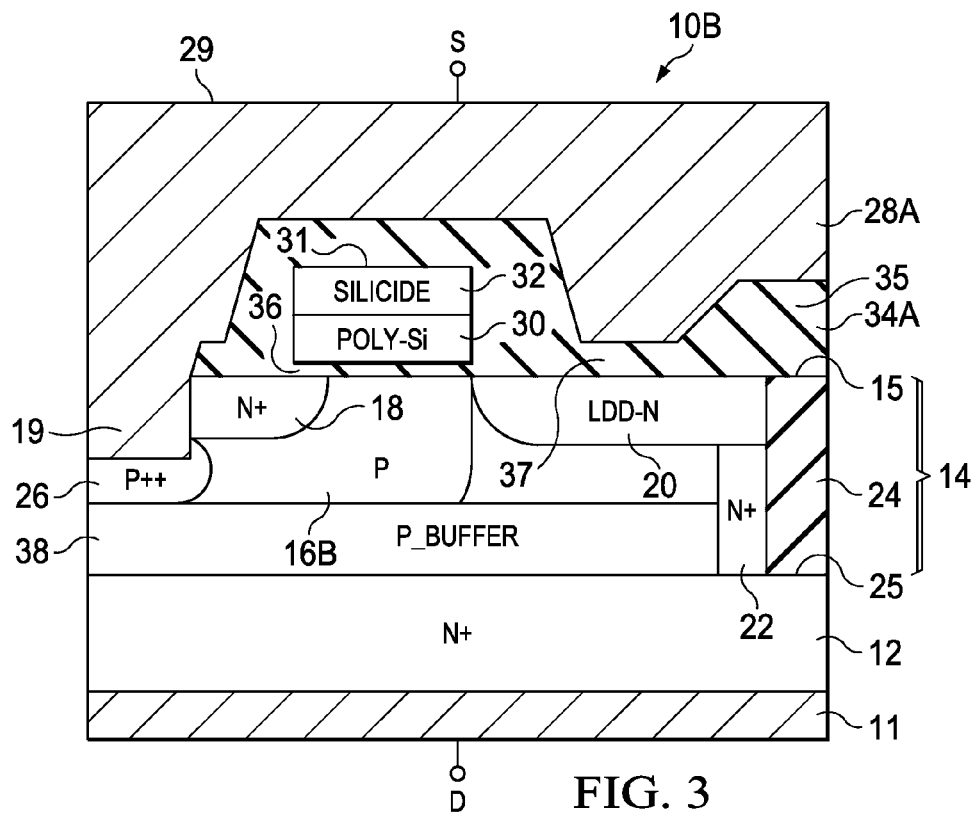
FIG. 3 is an illustration of an embodiment of a LDMOS transistor of the present invention having a buffer layer for suppressing short channel effects.

FIG. 3 illustrates another alternative embodiment 10B of the LDMOS device of either FIG. 1 or FIG. 2. The device 10B of FIG. 3 is identical to the devices 10, 10A except in the following respects: the depth of body implant region 16B is reduced and a first buffer region 38 is provided between body region 16B and substrate 12. In an exemplary embodiment, first buffer region 38 comprises a layer of silicon doped with p-dopants at a concentration equal to or greater than the dopant concentration of the body region 16B. The buffer layer 38 abuts the sidewalls of vertical drain contact 22, and is preferably formed to a thickness between about 0.3 to 0.6 μm. In one embodiment, the buffer layer 38 is formed by deep implantation of Boron into the epitaxial layer 14. In the embodiment 10B from FIG. 3, this deep implantation is performed after the patterning of the thick oxide 34A but before the formation of the gate. The buffer layer 38 serves to suppress the well documented short channel effects by helping to ensure that the depletion region does not reach too far into the channel.

In the embodiment of FIG. 3, the breakdown location is still dependent in part on the thickness of epitaxial layer 14 and on the doping concentration of the substrate 12. Turning to the embodiment 10C of FIG. 4, the buffer layer 38 is replaced with thinner p-buffer layer 38C and second buffer layer 40 having dopant concentration N. In this double deep implant buffer construction, the breakdown location is advantageously located at or around the P-N junction between buffer layer 38C and buffer layer 40, making the breakdown location largely independent of the thickness of the epitaxial layer and the dopant concentration of the substrate 12. The deep implantation of N dopants (preferably Phosphorous) to form the second buffer layer 40 is performed at the beginning of the process flow, after the deposition of the epitaxial layer 14.

Figure 4:
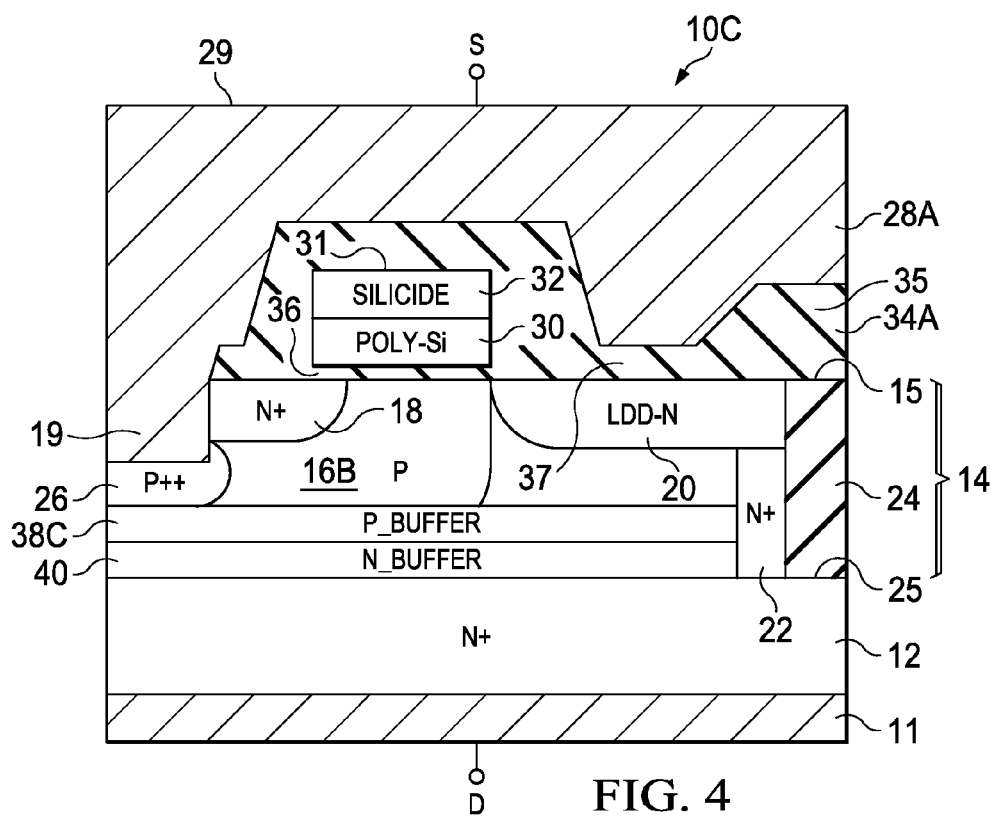
FIG. 4 is an illustration of an embodiment of a LDMOS transistor of FIG. 4 having a second buffer layer for improving the breakdown characteristics of the improved transistor.
Figure 5:
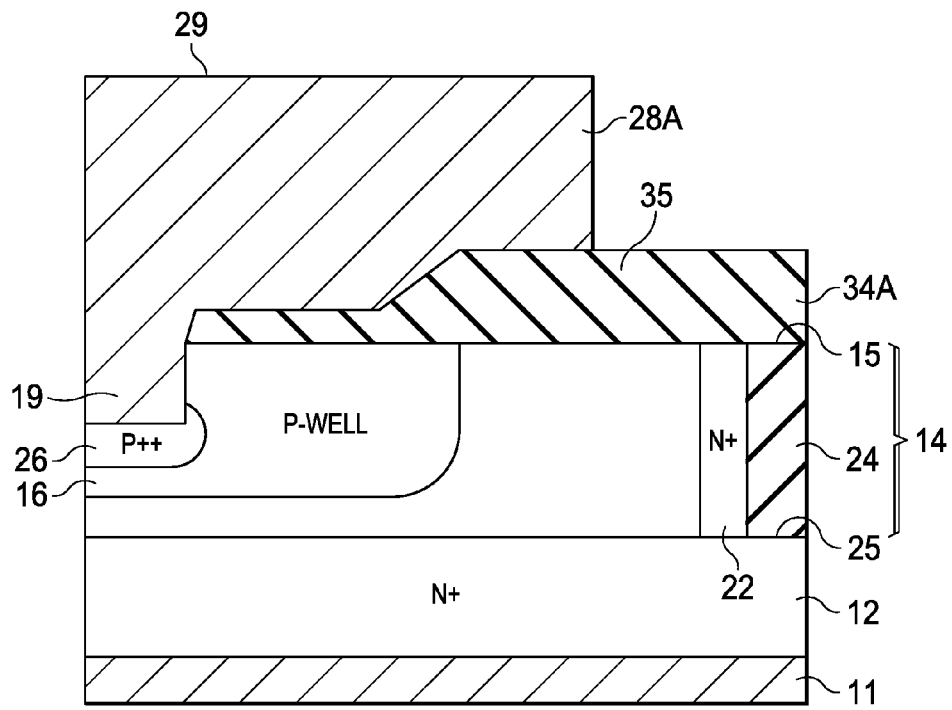
FIG. 5 is an illustration of a region proximate to a side edge of a semiconductor substrate having the improved LDMOS transistor formed thereon.

FIG. 5 illustrates the edge termination at the peripheral cells of the device of FIG. 2, so no gate is shown. The structure of the edge termination is important from a design perspective because it closes the P-N junction in a manner assuring the target breakdown voltage. The illustrated edge termination region surrounds the active area of the transistor(s) created by P-well 16. It should be understood that a single die can have a plurality of identical transistor cells as described above fabricated in parallel and operating as a single transistor in, for example, a power switch. The source metal 28A extends beyond the P-well 16 and acts as a field plate (which affects the breakdown voltage in this region of the device), as described above in connection with FIG. 2. The insulation layer underneath the field plate portion of layer 28A (again illustrated by reference number 35) has a thickness between about 0.2-0.5 μm, like thicker oxide portion 35 of insulation layer 34A shown in FIGS. 2-4. The drain plug 24 is formed at, or proximate to, the edge of the singulated die having the transistor formed therein, i.e., the die is singulated from adjacent dies on a wafer at or proximate to the drain plug 24. The edge termination region ends with drain plug 24 separating the transistor from the edge of the singulated die. This illustrated structure is the natural consequence of the formation of the structure of FIG. 2.

In a preferred embodiment, the background doping of the epitaxial layer is $1 \times 10^{16}$ atoms/cm$^3$, the P-well 16 is formed by overlapping deep buffer 38 (FIG. 3) and body 16 implantations and the distance between the P-well and the drain plug is 1.5 μm. This edge termination can support breakdown voltages higher than 35V.

In an exemplary application, the improved power LDMOS device is fabricated in parallel with a plurality of other similarly structured devices and packaged for use as a power transistor in, for example, a DC/DC voltage regulator.

Figure 6:
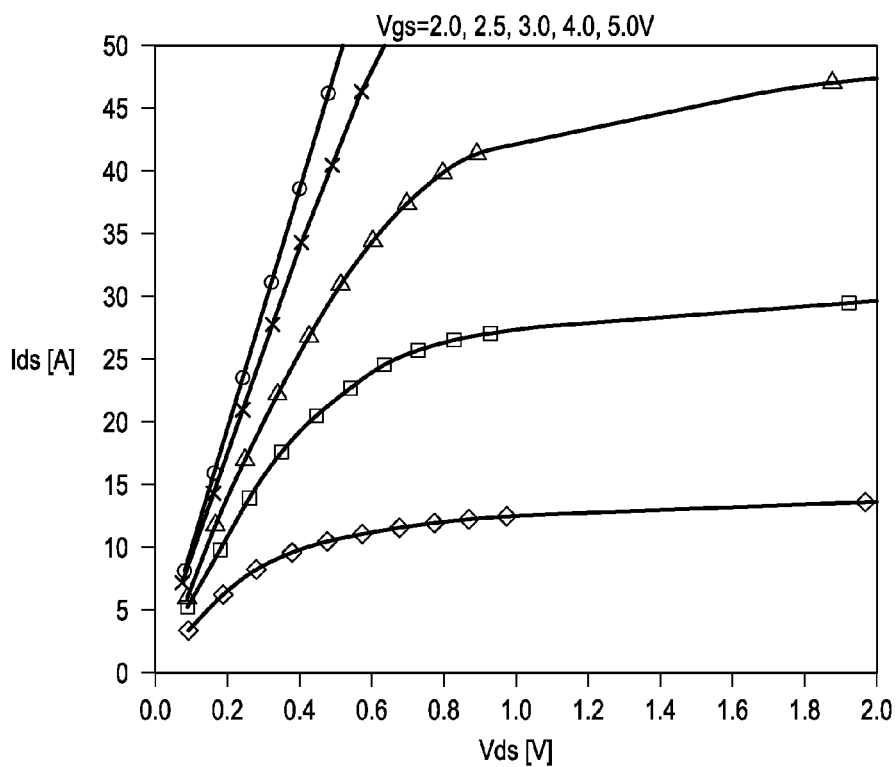
FIGS. 6-10 show electrical characteristics of the improved power LDMOS device obtained by numeric simulation.

FIGS. 6-10 show electrical characteristics obtained by numeric simulation of a 20V device 10 of FIG. 4 with an active area of 1 mm$^2$ designed for a maximum breakdown voltage of 20V and a maximum allowed source-to-gate voltage of 12V, with a gate thickness of 300 Å. FIG. 6 shows drain current as a function of the drain voltage at Vgs equal to 2.0, 2.5, 3.0, 4.0 and 5.0 volts. The flat Ids curve in saturation region (Vds>1V) shows the transistor is free of short channel effects.

Figure 7:
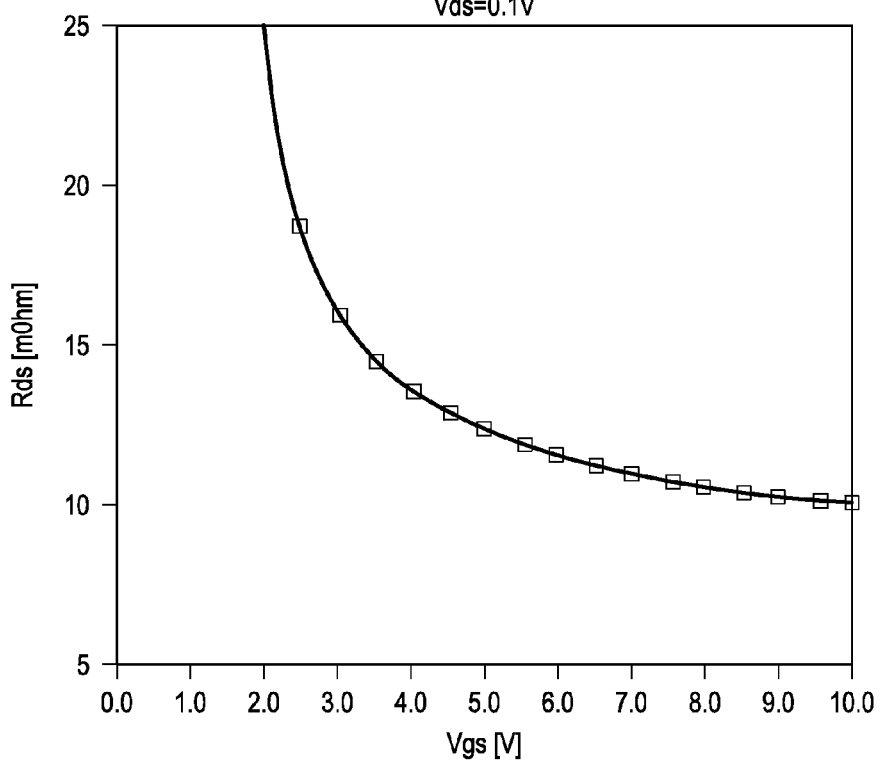

FIG. 7 shows the resistance of a device with an active area of 1 mm² calculated as a function of the gate voltage for the drain voltage of 0.1V. It can be seen that the resistance predicted for Vgs equal to 4.5V is about 13 mΩ*mm², whereas the resistance of similar devices in the art is higher than 20 mΩ*mm².

Figure 8:
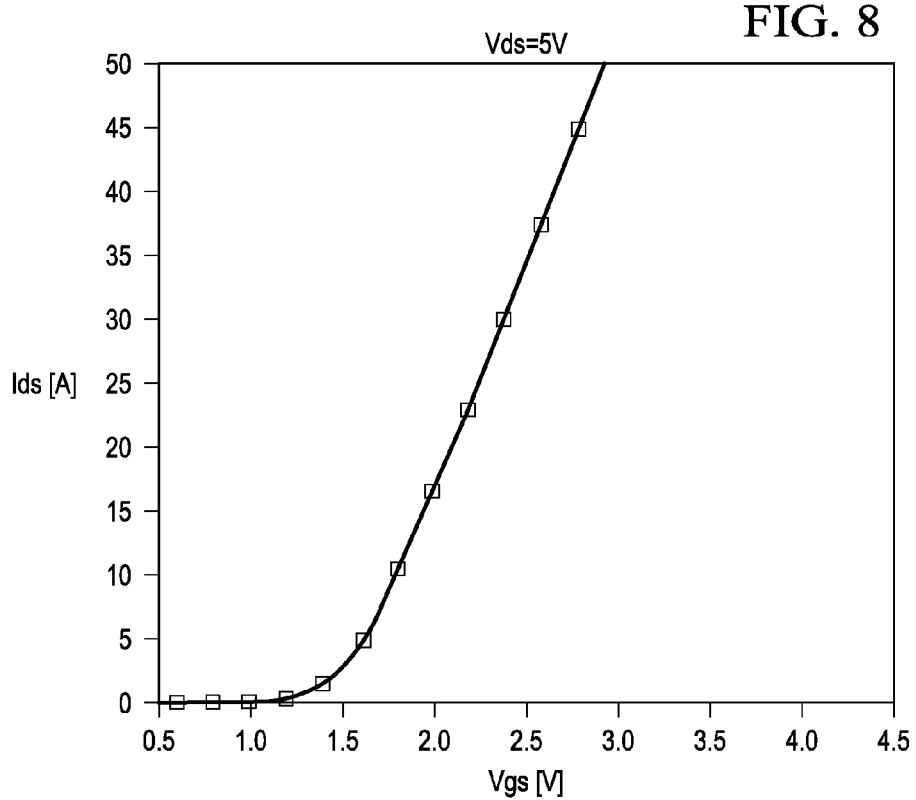

FIG. 8 shows the drain current as a function of the gate voltage for a drain voltage of 5V. It can be seen that the threshold voltage of the transistor is kept at a low value below 1.5V, which is advantageous for power applications. In contrast, modern power MOSFETs with short channel lengths usually result in a much higher threshold voltage of more than 2.2V to keep the device free of short channel effects.

Figure 9:
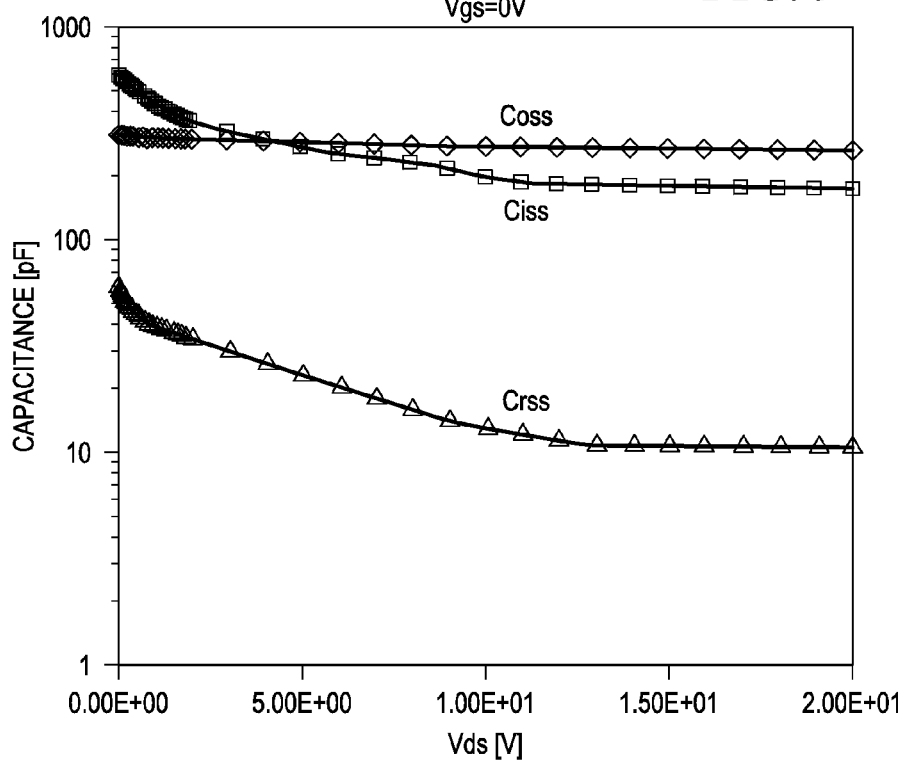

FIG. 9 shows the capacitances Ciss, Coss and Crss as a function of the drain voltage, where Ciss is the input capacitance (Cgs+Cgd), Coss is the output capacitance (Cds+Cdg) and Crss is the feedback capacitance (Cdg). Cdg is very close to Cgd, depending on to what terminals the source signals are applied and at what terminals the response signals are measured. Generally speaking, the proposed device has smaller capacitances than the commercially available products. Particularly, the feedback capacitance Crss (approximately equal to Cgd) is smaller by a factor of 5 than similar existing power MOSFETS.

Figure 10:
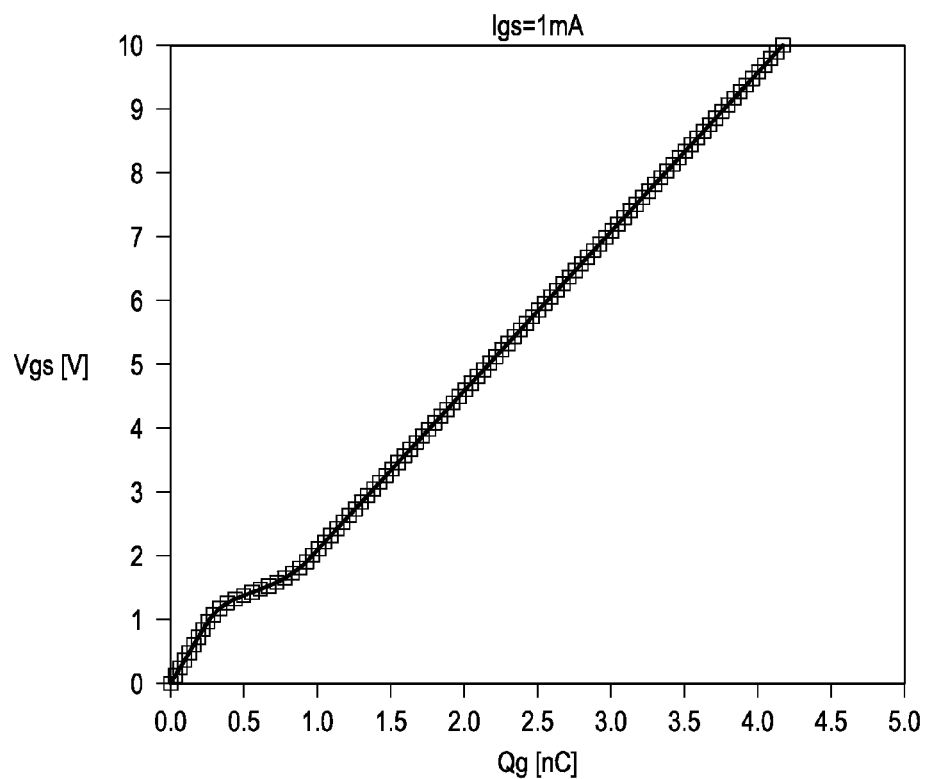

Finally, FIG. 10 shows a gate charge curve. It can be seen from the curve that that a gate voltage of 5V can be reached by charging the gate with only 2.2 nC/mm². This is a very low charge providing an accepted figure of merit of Rds (Vgs=10V)*Qg(VS=5V) of 22 mΩ*nC, whereas the similar devices in the art result in values higher than 50 mΩ*nC.

As set forth above, an improved power LDMOS device is provided having an n-channel transistor formed over a low resistance N-substrate. The device exhibits low on-resistance ($R_{ds-on}$) by lowering the resistive contribution of the substrate and low Cgd capacitance by minimizing the electrostatic coupling between the gate and drain electrodes. In embodiments, the source contact extends over gate and drain regions, thereby providing a high current capability.

Figure 11:
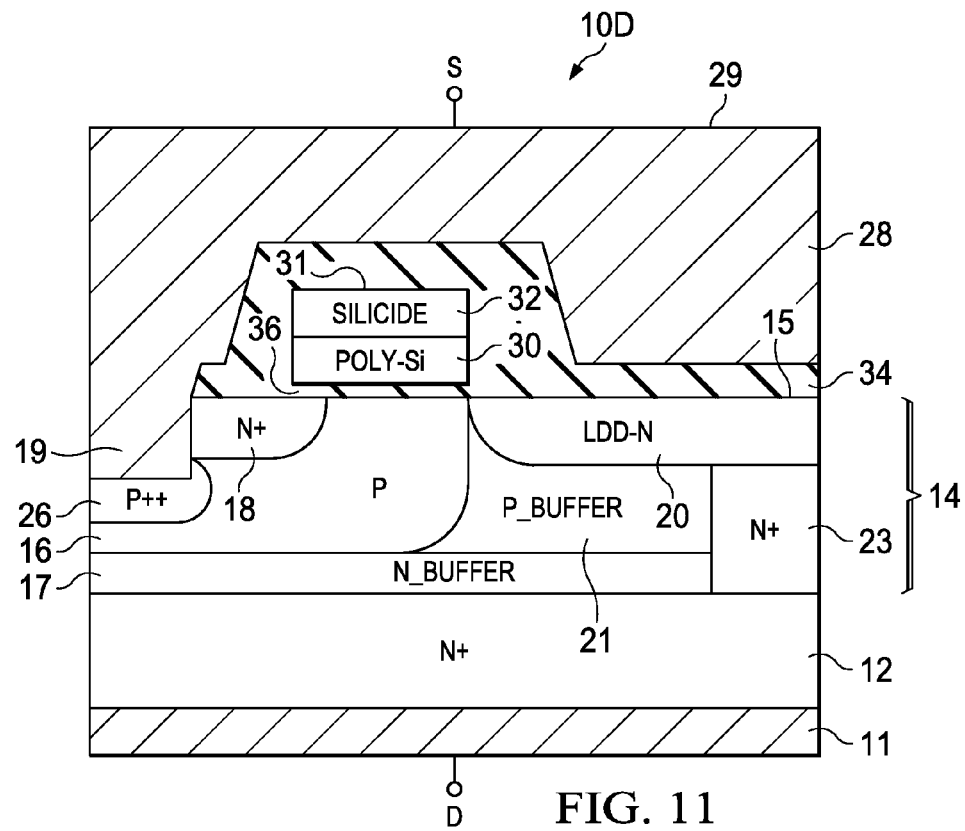
FIG. 11 is an illustration of a LDMOS transistor according to an alternative embodiment of the present invention.

FIG. 11 is an illustration of an alternative embodiment of an improved power transistor, more specifically an improved LDMOS transistor 10D. In exemplary applications, the transistor 10D is used as a switch in a voltage regulator of a power supply for, for example, a server or desktop computer or in a DC/DC converter for general use.

More specifically, FIG. 11 shows an improved n-channel LDMOS device 10D. The transistor structure 10D includes a N+ doped semiconductor substrate 12 as described above, although in alternative embodiments the substrate 12 may be P+ doped. In embodiments, a drain electrode 11 is formed along the bottom of the substrate 12 and is electrically connected to the N+ substrate 12.

As described above, a semiconductor layer is formed over substrate 12. In embodiments, the semiconductor layer is a lightly doped silicon epitaxial layer 14 formed over the upper surface of substrate 12. The epitaxial layer 14 has an upper surface designated by the reference number 15. The epitaxial layer is lightly doped at fabrication for reasons not pertinent to this disclosure and then doped to form the illustrated doping profile as described in more detail below. In one embodiment, the epitaxial layer 14 has a thickness between about 1.5 to 3.5 μm. The epitaxial layer thickness is referred to as the metallurgical thickness of the grown layer.

The doping of the epitaxial layer 14 is usually much lower than the doping concentration of the implanted source/drain regions. The original doping of the epitaxial layer has no effect on the resistance of the device because the current flows through the vertical drain contact region 23 (described below). In one embodiment, the initial doping concentration can be kept very low, below $2 \times 10^{16}$ atoms/cm³, and more preferably at or below $8 \times 10^{15}$ atoms/cm³, for example. A conductive gate stack 31 (described above) overlies the upper surface 15 of the epitaxial layer 14.

Drain implant region 20 is formed completely within epitaxial layer 14 and forms an enhanced drain drift region (labeled LDD-N). This region is also referred to herein as a drain extension region. The drain extension region 20 is formed abutting or at least proximate to the upper surface 15 of layer 14 and has a dopant concentration N in the illustrated embodiment, which is less than the dopant concentration (N+) of the highly-doped source region 18. As those skilled in the art will recognize, this drain extension region 20 increases the drain-to-source breakdown voltage of the LDMOS structure 10D. The LDD extension region 20 has a lateral dimension between about 0.3 to 1.5 μm, and a depth of between about 0.2 to 0.4 μm, although these dimensions vary based on the desired breakdown voltage rating of the device. The region 20 preferably extends below (i.e., is overlapped by) the conductive gate 31 between about 0.05 to 0.15 μm.

The LDMOS structure 10D also includes a source implant region 18 having a conductivity N+ spaced from the enhanced drain drift region 20. Source region 18 extends laterally between about 0.3 to 0.8 μm, has a depth between about 0.15 to 0.3 μm and also partially underlies the conductive gate 31 between about 0.05 to 0.15 μm. The slight overlapping of the source and drain regions 18, 20 by the gate 31 provides continuous conduction in the channel region of the device.

A body region 16 having P-type dopants and having a conductivity of P concentration is formed in epitaxial layer 14 and has a subregion between the source 18 and enhanced drain region 20, forming the channel region therebetween. The body region 16 includes body contact region 26. In exemplary embodiments, the body region 16 is formed to a depth of between about 0.5 to 1.0 μm and horizontal length between about 0.8 to 1.5 μm.

The body contact region 26 has a high dopant concentration, such as P++, which is greater than the dopant concentration of the body region 16. As described above, in one embodiment, the body contact region 26 is formed at the base of a shallow trench region 19 formed in epitaxial layer 14 and has a half width lateral dimension between about 0.1 to 0.3 μm (meaning the width attributed to one cell of a pair of adjacent cells) and a depth between about 0.1 to 0.3 μm. The body contact region 26 provides for a low resistance contact between the source metal layer 28 and the body region 16. Under blocking condition where the voltage applied to the drain electrode results in a reverse bias of the body-to-drain PN-junction, the depletion layer or region is "squeezed" in the vertical direction between the contact implant 26 and the doping gradient from the N doped buffer layer 17 or the N+ doped substrate 12 (in embodiments without N-buffer 17). The reduced width of the depletion layer results in a lower source-drain breakdown voltage, but localizes the place where the breakdown occurs at beneath the contact implant region 26. This, in turn, defines the path for the current generated during the avalanche condition, i.e., when the electric field at the body-to-drain PN-junction is so high that it leads to the generation of minority carriers by impact ionization.

Though the localized breakdown voltage below the implant region 26 may be lower than the breakdown voltage along the top surface of the drain extension region 20, shifting the breakdown location provides several benefits. First, the hot carriers present at, for example, turn-off of the transistor are generated away from the gate stack 31, which improves the reliability of the gate oxide 36. The electric field at the corner region of the gate oxide never reaches critical levels. Second, in embodiments, the doping concentration of the drain extension region can be increased (to the higher portion of the doping range for "N" implantation), thereby reducing its lateral resistance and any associated contribution to the Rds,on of the device. A peak concentration above $1\times10^{17}$ atoms/cm$^3$ can be achieved when charge balance design guidelines are observed as described below.

The transistor device 10D also includes an insulating layer 34 as described above.

As described briefly above, the device includes highly conductive region 23 formed in the epitaxial layer 14 and electrically connecting the drain extension region 20 to the conductive substrate 12. In prior art LDMOS transistor devices, the breakdown voltage of the transistor is highly sensitive to any variation in the separation between the distal edge of the drain contact to the gate 31. This distance defines the length of the drain extension region and can vary in the manufacturing process as it involves the alignment tolerances of both the gate 31 and the drain contact. Variation of the LDD extension region length in turn makes the optimization of the device design difficult and narrows the manufacturing windows.

In a preferred embodiment of the device of FIG. 11, the conductive region 23 is an N+ doped implant region 23 formed between the substrate 12 and the drain extension region 20. This doped region 23 is laterally and vertically spaced from the gate 31. A topmost portion of the doped region 23 is also vertically spaced (i.e., recessed from) from the upper surface 15 of the epitaxial layer 14. In embodiments, doped region 23 is spaced from the upper surface 15 of the epitaxial layer 14 by at least a part of the drain extension region 20. In embodiments, the highly-doped implant region 23 can extend partially into the drain extension region 20 though in preferred embodiments it is substantially limited to the area defined between the drain extension region 20 and the substrate 12 as long as electrical contact is made to the drain extension region 20. Doped drain contact region 23 provides a low resistance path between the drain extension region 20 and substrate 12, and thus to the drain electrode 11. In the n-channel embodiment shown in FIG. 11, the drain contact 23 has a dopant concentration of N+ or higher. In one embodiment, drain contact 23 has a horizontal width in epitaxial layer 14 in the amount of about 0.2 to 0.04 µm (half width).

The use of N+ doped region 23 as the contact between the drain extension region 20 and the substrate 12 provides several manufacturing and operational benefits. This doping profile is easily applied to low voltage MOSFETs where the flat portion of the doping of the epitaxial layer 14 is short and amounts typically to between about 0.5-2.5 µm. For example, in a case of an n-channel MOSFET designed for Vds,max of 20V, the drain plug region 23 can be formed by two consecutive implantations of phosphorous. In this embodiment, the first implantation has a dose of 8e12 cm$^{-2}$ at 200 keV and the second implant has a dose of 8e12 cm$^{-2}$ at 800 keV. These implantations can be masked by a double layer of an oxide with a thickness of about 1.5 µm covered by a photoresist with a thickness of about 1.3 µm formed over upper surface 15 of the epitaxial layer 14.

The doped drain contact region 23 creates a region of high conductivity which is inserted between the drain extension region 20 and the doping profile created by the substrate 12 of the epitaxial layer 14. The preferred doping concentration in this region is at least $1\times10^{18}$ atoms/cm$^3$. An important feature of the doped drain contact region 23 is that the region is substantially or entirely confined below the drain extension region 20. This feature makes the breakdown voltage of the transistor 10D much less sensitive to the variation of the distance between the drain contact and the conductive gate 31, which improves the processing windows for their fabrication. As also explained below, this modified structure allows a design with a shorter length (in the order of 70% to 90% of the original LDD length) for the drain region 20 when compared with devices having the same breakdown voltage. This, in turn, makes the pitch of the active cell smaller, which in turn increases the density of the channel of the MOSFET per unit area, lowering the specific resistance of the device (Rds,on*area). Without this recessed design, the drain extension region is necessarily made longer, so as to laterally space the drain contact from the conductive gate in order to lower the high electric field along the epitaxial layer surface. If the drain contact is not recessed, then the breakdown occurs parallel to the surface of the epitaxial layer and the depletion region is squeezed near the surface of the epitaxial layer, and the long LDD extension region is needed to accommodate the breakdown in order to reach a target breakdown voltage. With the design of FIG. 11, the high electric field is moved deeper into the epitaxial layer, and a sloped (e.g., approximately a 45° angle) gradient of impact ionization strength can be observed. The high electric field occurs at the region with the highest conductivity, i.e., the recessed drain contact region 23 rather than at the drain region 20. This allows for a more relaxed design and higher breakdown voltage (e.g., 5-7V higher) when compared with devices having the same pitch.

In preferred embodiments, the epitaxial layer 14 of the LDMOS device 10D is doped to include a thin N-doped buffer layer 17 (labeled N_buffer) formed directly over the substrate 12. In embodiments, the doping concentration of the buffer layer 17 is comparable to or slightly higher than that of body region 16, i.e., N doping concentration. This buffer region 17 is used to clamp the breakdown voltage of the transistor underneath of the source contact region, i.e., underneath implant region 26, thus suppressing the impact of the variation in the epitaxial layer thickness on the performance of the device.

A P-doped buffer layer 21 is formed over the N-doped buffer 17, below the LDD extension region 20, and laterally between the p-body 16 and N+ doped drain contact region 23. The buffer layer 21 is separately doped from the body region 16 and the sheet charge in this layer (concentration times thickness) is comparable to the sheet charge within the LDD layer 20). This buffer layer 21 is discussed in more detail below.

The drain extension region 20 and buffer region 21 fulfill the design guidelines of charge balance as discussed in, for example, U.S. Pat. Nos. 4,754,310 and 5,216,275, the entirety of which are hereby incorporated by reference herein. This charge balance technique, also called charge coupling, substitutes the single high-resistivity portion of a conventional transistor drain region, which is supposed to absorb the high blocking voltage of the device in a depletion layer, with an interleaved structure of first and second regions of alternating conductivity types. With increasing breakdown voltage, the drift region of conventional drains must be made longer with less doping in order to increase Rds. To achieve a desired breakdown voltage in the device structure, the charge in the regions is balanced and optimized for the highest breakdown voltage and lowest Rds-on. The thickness of the doping concentration of each of these first and second regions is such that when depleted, the space charge per unit area formed in each of these regions is balanced. In the preferred embodiment of the invention, the charge balance is provided between the drain region 20 and the P-buffer region 21. The depletion region develops simultaneously in these two regions with a compensated net charge, and the resulting electric field distribution is uniform. This technique leads to a shorter distance required to sustain a target blocking voltage of the device and allows a higher doping level, i.e., higher conductivity, in the drain region 20. In embodiments, the doping level is increased by about 10-30 times, from N− to N doping levels. This reduces the resistance of the region 20.

N-doped buffer region 17 has a dopant concentration N and P-doped buffer region 21 has a dopant concentration P. The deep implantation of N dopants (preferably Phosphorous) to form the buffer layer 17 can be performed at the beginning of the process flow, after the deposition of the epitaxial layer 14. Buffer layer 21 can be formed after implantation of layer 17 or after the formation of drain plug 23.

The source metal layer or electrode 28 of the device 10D preferably comprises conductive material selected from the group consisting of Al, Ti/Al, Ti/TiN/Al or W blanket deposited over the device such as by CVD (chemical vapor deposition) or by sputtering. The metal layer 28 may comprise multiple layers of metal or metal alloys. In embodiments, the source electrode 28 may be wire bonded or soldered directly to the external package electrode. The source electrode 28 is deposited to fill shallow trench 19 to provide an electrical contact with the source implant 18 as well as to provide a short between the source 18 and body region 16. Source electrode 28 extends over insulation layer 34 and covers the entire surface area of the wafer, including the gate structure 31 and drain extension region 20 (except for a small area set aside for the gate contact). In one embodiment, the source metal layer 28 has a thickness defined between the upper surface 15 of the epitaxial layer 14 and its upper surface 29 between about 1.0 to 5.0 μm.

When the device 10D is turned "on," the conduction current flows through the source metal 28, through source region 18, laterally through the channel underneath the gate 31 to the drain extension region 20, through the drain extension region 20 to the vertical highly-doped drain contact 23 to the substrate 12, and through the substrate 12 to the drain electrode 11, which is electrically coupled to the bottom side of the device 10D.

The source metal structure 28 of FIG. 11 provides several advantages. First, a single conductive layer can serve as both a source contact and a shield electrode, which shields the conductive gate 31 from the drain contact 23 and reduces the capacitance between the gate and drain (Cgd). Due to the recess of the drain contact region 23 below the surface 15, the insulating layer 34 may now have a single uniform thickness approximately equal to the thickness of the thinner portion 37 in the FIGS. 3 to 4. There is no need to form a separate shield gate nor is there a need to separately connect the shield gate to the source 18. The manufacturability of the device is thereby greatly improved.

Further, the drain-source resistance (Rds) is optimized by the use of an N+ substrate 12. Even though p-doped substrates of the prior art provide much higher resistances than n-substrates, often 2 to 3 times higher, as those in the art will recognize, n-channel devices designed for RF applications are typically formed on P+ substrates because it is important to have the source electrode at ground potential at the bottom of the die. The present transistor device 10D, however, provides an n-channel device on a low resistance n-doped substrate 12.

In one embodiment, additional charge coupling can be induced by overlapping the source metal 28 with the drain extension region 20 and separating the two regions with an insulating layer 34 of a pre-defined thickness. In embodiments, the insulating layer 34 has a thickness in this region of between about 0.05 to 0.15 μm. Optimal thicknesses can be determined using numerical simulations and optimizing the electrical field distribution. This charge coupling effect allows an additional increase of the doping concentration in the drain extension region 20 to lower the Rds.

An exemplary method of forming device 10D is now described. Certain details which will be readily apparent to those in the art are eliminated so as to avoid obscuring the present invention. Substrate 12 is provided with a pre-defined N+ dopant concentration. Next, epitaxial layer 14 is formed over the upper surface of the substrate 12. Optionally, N-buffer layer 17 is formed by the deep implantation of N dopants (preferably Phosphorous) after the deposition of the epitaxial layer 14. An oxide layer used as a drain contact mask is formed and patterned over the epitaxial layer 14. Implant region 23 is formed using the dual implant process described above. Part of the oxide layer is removed using an etch process revealing the active area of the transistor as defined by a dedicated photoresist mask. The P-buffer layer 21 is implanted within the transistor active area. The photoresist mask is removed and the remaining oxide layer is used as a so called field oxide covering the die around the active transistor area.

After forming the drain contact 23, a thin gate oxide layer 36 is formed over the upper surface 15 of the epitaxial layer 14. Next, a layer of polysilicon is deposited and etched to form a polysilicon gate layer 30. Silicide layer 32 is then formed using the well know salicide process or a silicide layer is deposited over the polysilicon layer 30 and etched therewith to form the stacked polysilicon/silicide structure 31 shown in FIG. 11. Following the formation of silicide layer 32, the P-body 16 and drain extension region 20 are formed by masked implantation of respective dopants and thermal diffusion steps. The side wall spacers adjacent the conductive gate 31 can be separately formed using a known side wall spacer process, if necessary. For example, an oxide layer can be deposited and etched back with an anisotropic reactive ion etch (RIE) to form insulating spacers. The N+ source region 18 is formed by implantation of Arsenic using a patterned photoresist as a mask.

An oxide layer 34 is deposited over the upper surface 15 and conductive gate 31 to the desired thickness. Shallow trench 19 is patterned and etched to the desired depth, followed by formation of implant region 26. Finally, a metal layer is deposited over the entire structure and patterned to form source electrode 28. The original substrate is then thinned to a desired thickness and a backside metal 11 is deposited to from the drain electrode. The device is then packaged and tested.

Various other embodiments of the transistor device 10D are described below. These devices can be formed using the process described above, with modification to the process not described herein that will be apparent to those of ordinary skill in the art.

Figure 12:
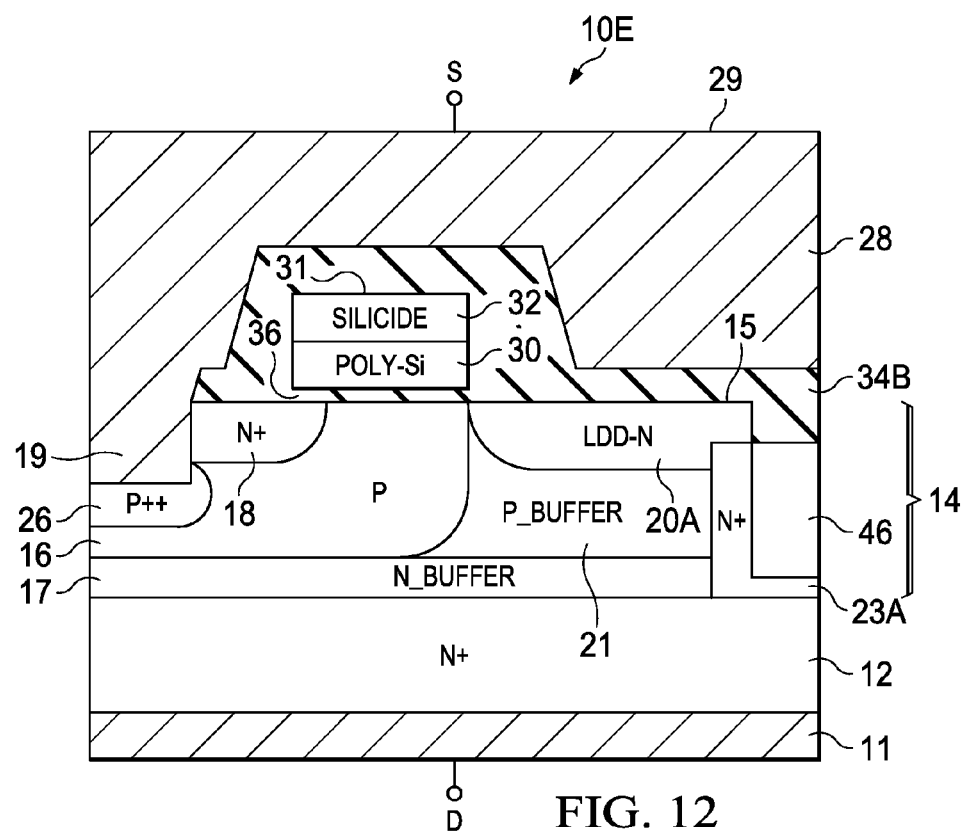
FIG. 12 is an illustration of an alternative embodiment of the LDMOS transistor of FIG. 11.

FIG. 12 illustrates an embodiment of an improved LDMOS transistor 10E. The transistor 10E is identical to the transistor 10D described above, except as described below, and like reference numerals identify like features. In the embodiment of FIG. 12, the epitaxial layer 14 includes a second trench 46 filled with doped polysilicon. The doped polysilicon is surrounded by the highly conductive (N+) doped implant region 23A. The polysilicon filled trench 46 is recessed from the top surface 15 of the epitaxial layer 14 in an etch back step after polysilicon deposition. In a preferred embodiment, the polysilicon is doped in situ. This recess is filled with dielectric material from insulation layer 34B. The polysilicon plug 46 is formed adjacent to drain extension region 20A. In this embodiment, the conductive region 23A is formed by diffusion of dopants from the doped polysilicon material into the surrounding portions of the epitaxial layer 14 to make electrical contact with both the drain extension region 20A and the substrate 12. Diffusion occurs during high temperature anneals that are employed in manufacturing the LDMOS transistor 10E and that will be familiar to those of ordinary skill in the art. Annealing steps are usually employed during gate oxide formation and/or to activate implanted dopants in the body or source/drain regions 16, 18, 20A. The N+ well 23A created around the polysilicon fill 46 forms a highly conductive drain plug connecting the drain extension region 20A to the substrate 12. As with conductive drain contact plug 23 described above, this highly-doped region 23A is spaced from the top surface 15 of the epitaxial layer 14, such as by at least a portion of the lightly doped region 20A and insulating layer 34B.

Figure 13:
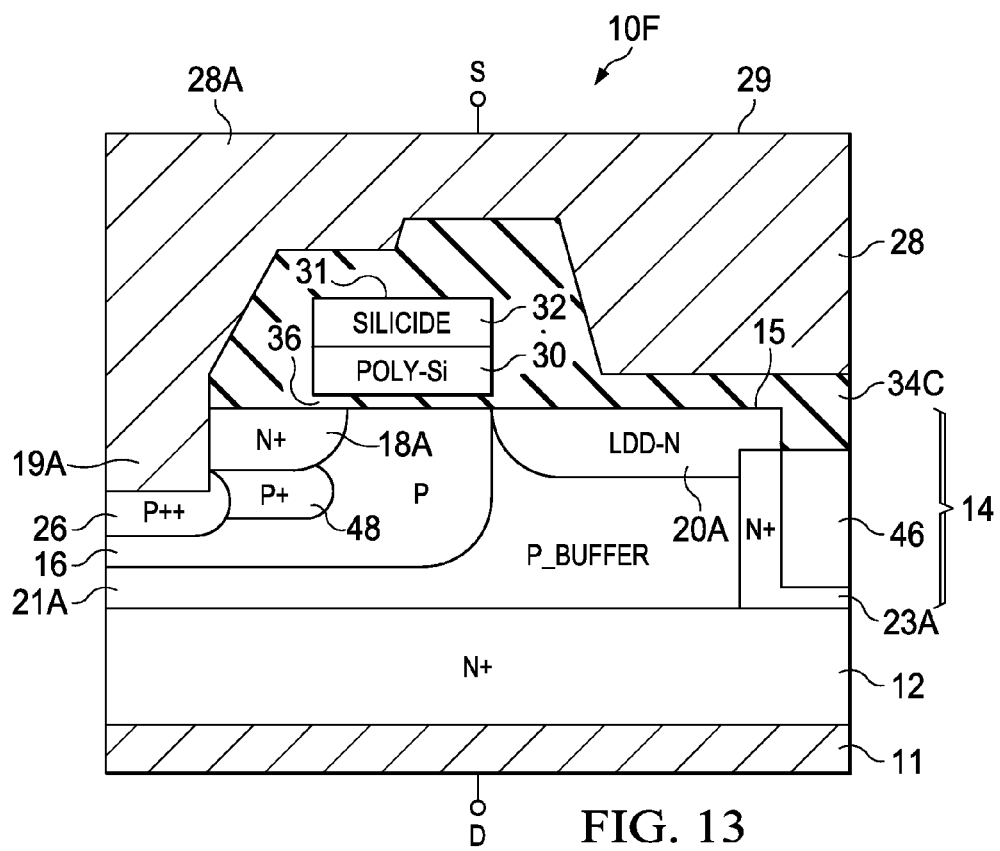
FIG. 13 is an illustration of an alternative embodiment of the LDMOS transistor of FIG. 12.

FIG. 13 illustrates another embodiment of an improved LDMOS transistor 10F. The transistor 10F is identical to the transistor 10E of FIG. 12 described above, except as described below, and like reference numerals identify like features. In this embodiment, the source metal layer 28A, which provides an electric short between the N+ source 18A and the underlying P-Body region 16, is formed by a metal filling a shallow trench 19A etched from the top surface 15 of the epitaxial layer 14 through the N+ source region 18A. In this embodiment, the source contact trench 19A is self-aligned to the conductive gate stack 31. This self-aligned approach allows for the reduction of the layout pitch, which increases the density of the channel of the MOSFET per unit area, thus lowering the specific resistance of the device (Rds, on*area). In the self-aligned process, the source contact mask has the contact opening extending at least partially over the conductive gate 31, which has been covered with a dielectric layer that is the precursor of dielectric layer 34C and that has a different thickness on the top of the gate 31 than on the silicon surface 15 of the epitaxial layer 14 in the contact area. Two depositions can be used to create the regions having different thicknesses. The thickness of the dielectric layer on the top of the gate structure 31 is significantly larger than in the contact area, such as by about 0.3 to 0.5 µm, so that the contact etch stops on or proximate to the epitaxial layer upper surface 15 before reaching the top surface of the gate stack 31. As a next step, the epitaxial layer 14 is etched in the contact area through the N+ source region 18A and to a depth below the N+ source region 18A to meet the body region 16. The second etch step uses an etchant that is more selective to the epitaxial layer 14 than to the dielectric layer 34C. The metal layer(s) for forming source electrode 28A is then deposited over the substrate as a continuous layer, with the metal filling the source contact trench 19A and overlapping the gate 31 and drain extension region 20A. The source contact opening in this embodiment is the same size as used to form the devices of FIGS. 11-12 but the separation between the contact window and the gate stack 31 is reduced by the overlap. This, in turn, reduces the pitch of the device 10F when compared with devices 10 to 10E.

In some embodiments, the source contact mask is also used to perform masked P+ implants into the P-body region 16. The first implant is performed after the oxide etch and creates a P+ region 48 just underneath of the N+ source region 18A. The implant 48 decreases the sheet resistance of the p-body 16A underneath the N+ source region 18A in order to avoid any triggering of a bipolar transistor action during avalanche breakdown. The second P++ implant 26 is performed after etching of the epitaxial layer 14 to form trench 19A. This implant is used to increase the dopant concentration at the interface of the source contact 28A to the P-body region 16A, improving the contact between the source metal layer 28A and the P-body 16A. Without N+ buffer layer 17, the location of the avalanche breakdown is pinned between implant region 48 and N+ contact 23 or 23A, rather than to just underneath of the source contact implant region 26.

As discussed, the P+/P++ implants 26, 48 are used to pin the electric breakdown of the transistor to the PN junction. The breakdown may be designed to occur at the PN junction underneath of the source-body contact or between the source-body contact and the drain plug 23, 23A located some lateral distance from the source contact. The second case, where the breakdown occurs between the source-body contact 26 and drain plug 23A, was confirmed by numeric simulation. The simulation showed the distribution of the impact ionization rate at breakdown in a cross-section of the transistor. The highest rate of the generation of minority carriers was distributed between the P-body 16 aside of the source-body contact 26 and drain plug 23 of the LDMOS transistor. The main impact of these embodiments is that the hot carriers present at, for example, turn-off of the transistor, are generated away from the gate stack 31, which improves the reliability of the gate oxide 36.

In an another alternative embodiment, the breakdown location is pinned between the p-buffer region 21A of FIG. 13 or p-buffer region 21 of FIGS. 11 and 12 and the drain-plug 23A where the drain plug structure 23A is formed adjacent to and from dopants originating within doped polysilicon filled trench 46 as shown in FIGS. 12 and 13. This is adjusted mainly by the level of doping concentration at the PN junction; if the concentration is high at both sides of the junction, the breakdown voltage is low. In this embodiment the dopant concentration within the P-buffer region 21A is increased beyond the optimum value as suggested by the charge coupling design guidelines discussed above, which results in a lower breakdown at the interface between the P-buffer 21A and the drain-plug regions 23, 23A. The charge coupling guidelines discussed above are intentionally violated in order to pin the breakdown voltage to this location. The P-buffer layer 21 concentration is increased just as much as needed to pin the breakdown. In one embodiment, the concentration is increased by about 30 to 50%. No N-buffer layer is used in the embodiment of FIG. 13 because increasing the concentration in the N-buffer would pin the breakdown voltage below the P+ contact implant 26. The N-buffer is not required to achieve this in the embodiment of FIG. 13.

Figure 14:
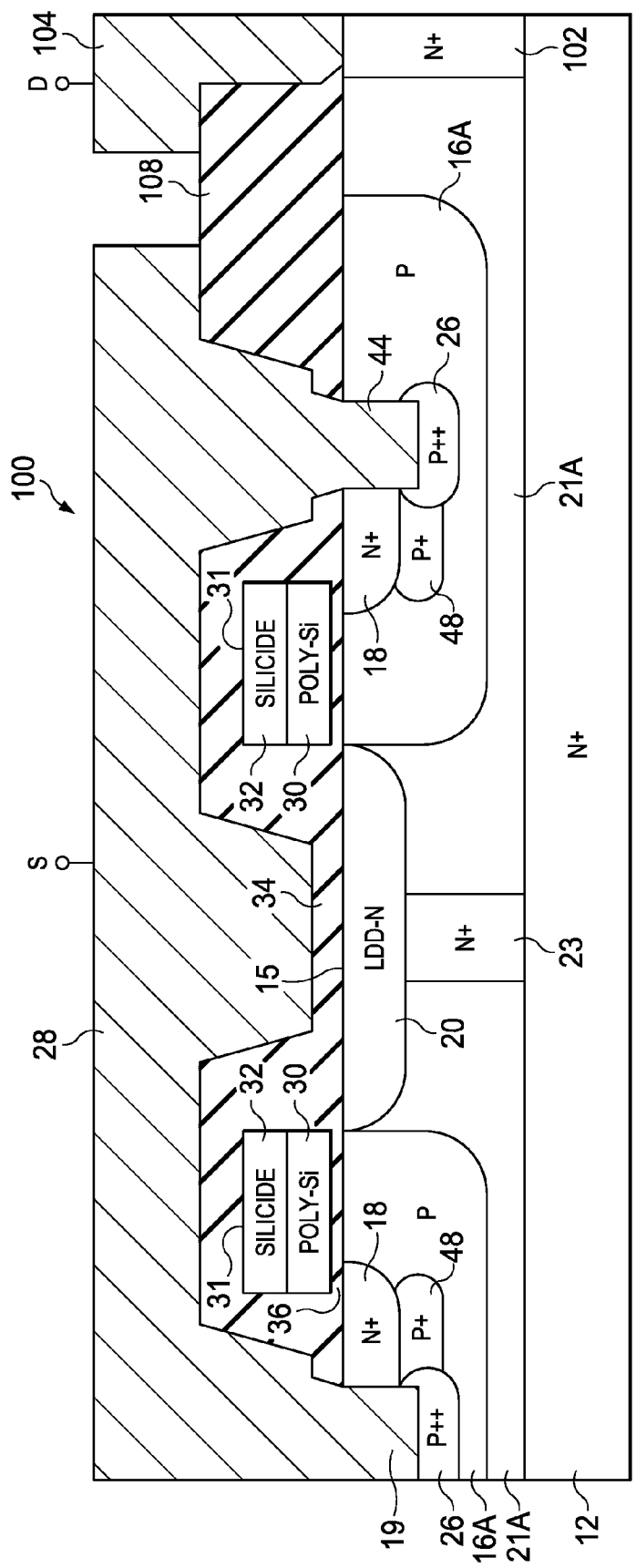
FIG. 14 is an illustration of a semiconductor device including a plurality of LDMOS transistors and having upwardly oriented source and drain electrodes.

FIG. 14 is a partial cross-sectional view of a macro-cell device 100 (sometimes referred to herein as a "quasi-lateral LDMOS device") comprising a plurality of parallel coupled LDMOS transistor devices as described above in connection with FIG. 11, 12 or 13. Those of ordinary skill in the art will understand that similar macro-cell devices can be formed using the LDMOS transistors of FIGS. 1-5. Various connections and configurations for these macro-cell devices are described in co-pending and commonly assigned U.S. patent application Ser. No. 11/254,482 to Korec et al., the entirety of which is hereby incorporated by reference herein. Although only two such LDMOS transistors 10D, 10E or 10F are shown in device 100, it should be understood that hundreds of such devices are electrically coupled in parallel to form a single functional macro-cell device 100. Connections of groups of these cells can be made by a bus structure (not shown) formed over the devices. In one embodiment, each macro-cell device 100 includes between about 50-200, and preferably about 100, LDMOS transistors 10D, each having a pitch of about 2 µm or less. As described in the '482 application and more fully below, an exemplary chip-scale or near chip-scale power LDMOS device includes several macro-cell devices 100 coupled together through the bus structure to operate as a single power LDMOS device.

The details of the individual LDMOS transistors shown in FIG. 14 are described above in connection with FIGS. 11-13. As described in connection with FIGS. 11-13 and as shown in FIG. 14, the source contact electrode 28 is disposed on the top surface of the device 100. However, unlike the embodiments of FIGS. 11-13, rather than place the drain electrode on the bottom surface of the device 100 (i.e., drain electrode 11 formed on the bottom surface of the substrate 12 (FIGS. 11-13)), the drain electrode 104, which comprises a conductive material described above in connection with source electrode 28, is also located at the top side of the device 100. This feature allows for the design of a power MOSFET with high current density as described in the '482 application. The drain electrode 104 is isolated from the source electrode 28 by insulation layer 108 formed over the top surface of the epitaxial layer 14. Drain electrode 104 is coupled to the substrate 12 via high density implant region 102. Current flows laterally through substrate 12 from implant regions 23 and then into conductive region 102, which collects the current from multi-cell groups, and then flows vertically into the drain electrode 104. The implant region 102 can be formed in the same process used to form implant regions 23 though followed with an additional contact implant to ensure high doping concentration just below and to the upper surface 15 of the epitaxial layer 14 so as to enable good electrical contact with drain electrode 104.

Figure 15:
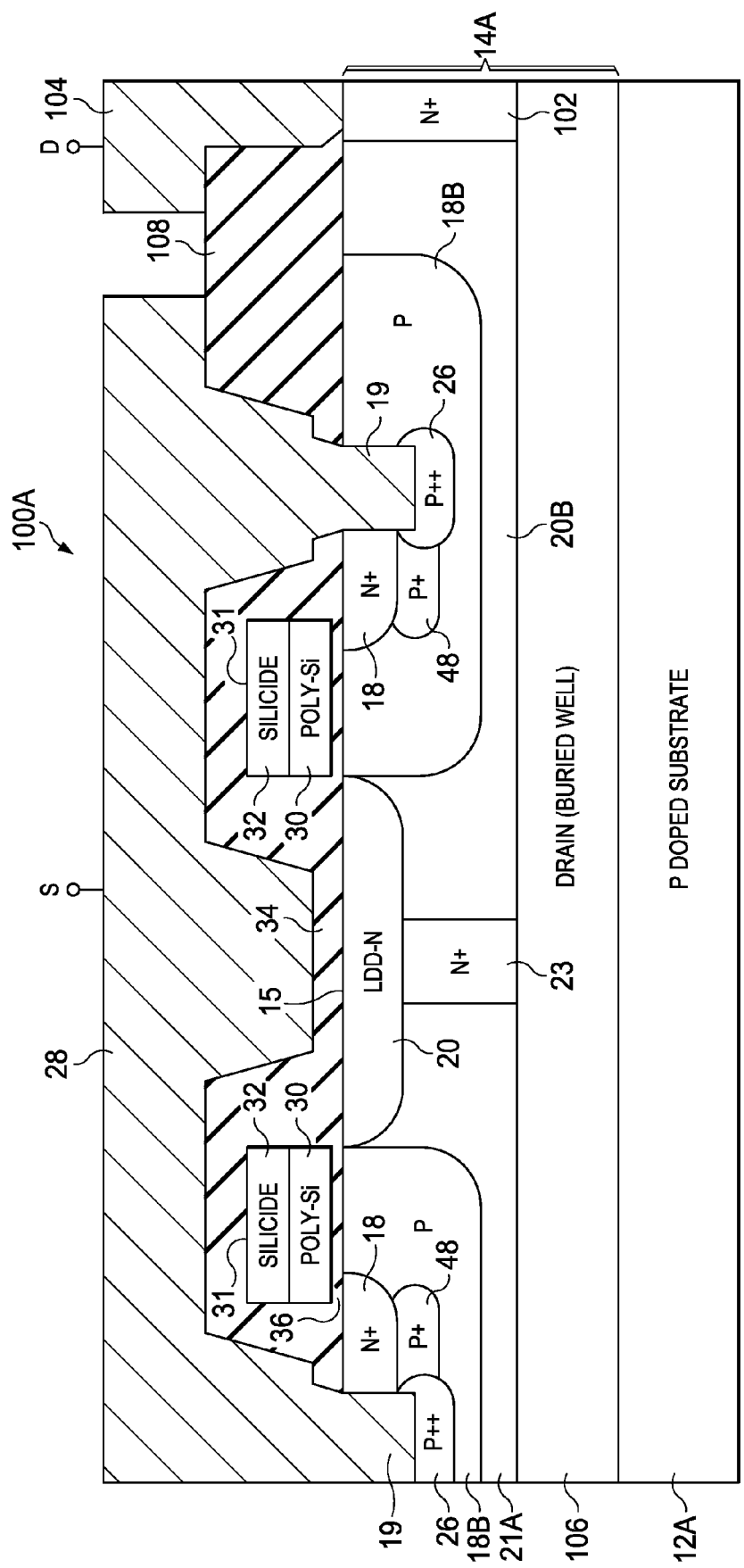
FIG. 15 is an illustration of an alternative embodiment of the device configuration of FIG. 14.

FIG. 15 illustrates an alternative embodiment of the macro-cell device of FIG. 15. The device 100A of FIG. 15 includes a P-doped substrate 12A rather than a N-doped substrate 12. The transistors 10D, 10E or 10F described above are formed over a buried layer 106, which is a highly-doped N+ layer formed in the epitaxial layer 14A. The buried layer 106 carries current from the transistors laterally to implant plug 102, which provides the current to the drain electrode 104. The buried layer 106 provides electrical isolation for the LDMOS transistors from the substrate 12A, allowing the integration of a number of independent LDMOS transistors (or other devices) over a common substrate 12A. For example, device 100A could form a power management IC with multiple independent integrated power switches. Though not shown in FIG. 15, the pitch of the LDMOS device can also be reduced by self-aligning the source contact opening to the gate structure as taught in connection with LDMOS device 10F of FIG. 13.

As set forth above, in embodiments, an improved power LDMOS device is provided having an n-channel transistor formed over a low resistance N-substrate. The device exhibits low on-resistance ($R_{ds\text{-}on}$) by lowering the resistive contribution of the substrate and low Cgd capacitance by minimizing the electrostatic coupling between the gate and drain electrodes. The length of the enhanced drain drift region can be reduced, allowing creation of devices of smaller pitch but having the same breakdown voltage as prior art devices. This, in turn, allows for improved device density and current capabilities.

In embodiments, the doping profile is selected and the drain connection is configured to optimize the breakdown location. The device can be configured such that it goes into breakdown at a pre-defined location of a PN junction in the vicinity of a P+ contact to the P-body layer. The region of the highest impact ionization rate can spread from the P+ contact vertically towards the substrate or laterally towards the drain plug region to pin the breakdown away from the gate stack and reduce the danger of triggering the bipolar transistor. The breakdown location can also be placed between a P-buffer layer and the buried drain contact. The doping structure controls whether the high impact ionization rate spreads vertically or horizontally. Optimizing the breakdown location helps prevent device breakdown as described herein.

With respect to FIG. 11 as an illustrative example, the Power LDMOS described herein reflects an innovative method of designing an LDD region 20 which is based on charge balance of the voltage supporting LDD region 20 (FIG. 11) with an opposite polarity doped region (e.g., P-buffer layer 21 of FIG. 11) and close capacitive charge control electrode coupling between the source electrode 28 and the drain extension region 20, i.e., the source electrode 28 will induce electric field in the extension region 20 since it overlays it with dielectric serving as an isolation. The combination of the opposite polarity and electrode regions maintain a high electric field inside the drift layer 20, thereby improving voltage rating and enabling increase of its doping and decrease in its length, which reduces the size of the transistor cell and its Rds,on.

The most optimized design for the breakdown voltage and minimum drift layer resistance is enabled when all three regions (drain extension 20, P-Buffer 21 and source electrode 28) are closely charge balanced. This occurs when the total net doping and distribution of dopants in the drain extension region 20 is closely equal to the net doping and distribution of dopants in the opposite polarity doped region underneath it (i.e., P-buffer layer 21). For the top source electrode 28 to be charge balanced with the Ldd region 20, the dielectric layer thickness of dielectric layer 34 is selected to impart an electric field inside the LDD region 20 large enough to improve breakdown but not to exceed the critical electric field in LDD region 20, which would cause a lower premature avalanche breakdown.

When doping and oxide thickness are optimized, such as with guidance by numerical simulation, a high electric field will be maintained in the LDD region 20 resulting in the increased breakdown voltage, since the voltage is the integrated area of the electric field along the length of the LDD region 20. An additional benefit is that, unlike traditional devices, higher doping of the LDD layer 20 can be used since the breakdown voltage is not limited by the LDD doping. Thus, the higher doping can be used to maintain the high electric field throughout the LDD layer 20. The voltage rating of the charge balanced LDD layer 20 can be increased by simply increasing the length of the LDD region 20, unlike with the traditional devices where the doping must be lowered with increases in the length of the LDD region.

In certain embodiments, some misbalance in charge may be intentionally introduced into the LDMOS transistor device by doping the P-buffer layer 21 beyond the optimum balance described above. This doping profile is believed to be advantageous from the perspective of avalanche breakdown handling capability since it serves to confine most of the avalanche current into the buffer layer 21 while relieving it from other layers. The significance of this attribute is that power devices are designed to have robust avalanche handling capability since they are used in circuits which due to fault or start-up conditions expose devices to avalanche breakdown. By confining the current to the P-buffer layer 21 the current will be extracted through the P++ layer 26. This path of current flow offers the lowest current resistance for reduction of heating and also prevents current from flowing under the source and thereby prevents parasitic bipolar latch-up (turn-on).

This charge balance technique is applicable to not only quasi-lateral LDMOS devices but also to other devices as described below in connection with FIGS. 16-31.

As described above in connection with the LDMOS transistor 10, power devices contain a voltage supporting region, typically called a drift region, which also serves as the main current conduction area. This region determines the voltage handling ability of the device and also has a large impact on any resistive loss and switching loss of the device. It is desirable to design the drift region for a high voltage rating but at the same time provide the drift region with higher doping and smaller size.

As described above and discussed further below, a design for the drift region structure which is based on charge balance of the voltage supporting region (i.e., the drift region) with an opposite conductivity doped region (i.e., buffer region) and close capacitive coupling of a charge control electrode (e.g., source electrode) is effective to maintain a high electric field across and inside of the drift layer, thereby improving the voltage rating of the device and allowing for an increase in doping in the drift region and a commensurate decrease in device size. The optimized design for the breakdown voltage and minimum drift layer resistance is provided when all three layers (drift region, opposite conductivity doped region and charge control electrode) are closely charge balanced. As described below, this charge balancing methodology is applicable not only to quasi-lateral LDMOS transistors as described above but also to purely lateral devices, diodes, bipolar devices and other devices. In some embodiments, a misbalance in the charge balance is induced when the opposite conductivity doped region is doped more heavily beyond what would be considered optimum doping for obtaining charge balance so as to improve avalanche breakdown handling capability by confining most of the avalanche current into this opposite conductivity doped region, relieving other layers of this current. As described above, robust avalanche handling capability is desirable for power devices since they are used in circuits that due to fault or start-up conditions expose the devices to avalanche breakdown.

Figure 16:
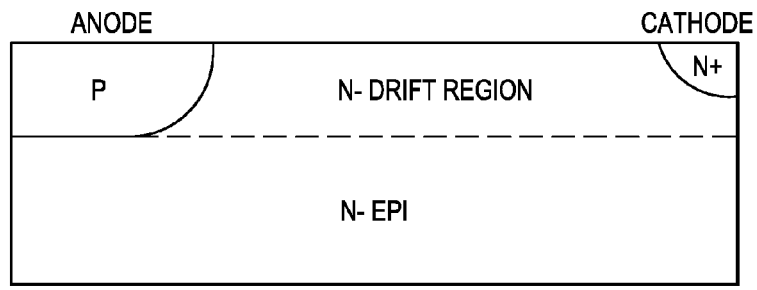
FIG. 16 illustrates a prior art p-n junction diode.
Figure 17:
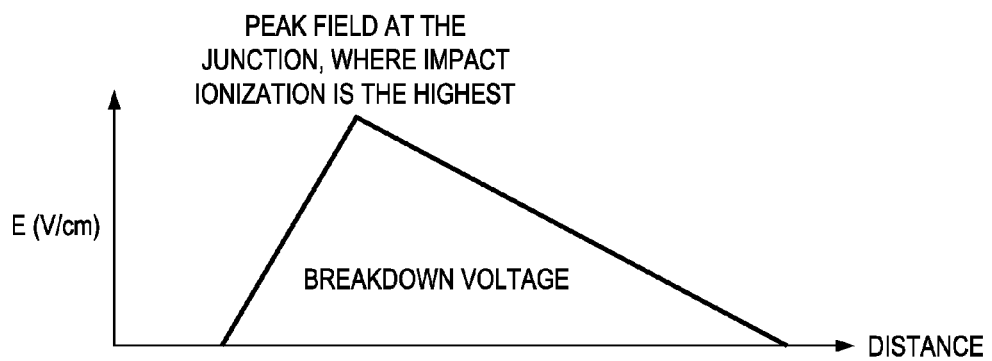
FIG. 17 shows the peak electric field within the drift region of the diode.

FIG. 16 shows a prior art voltage supporting design which includes a P-N blocking junction where a lightly doped drift region (labeled "N-drift region") forms the N-side of the P-N junction. FIG. 17, shows the electric field distribution in the voltage supporting drift region. As can be seen from the figure, the electric field decreases linearly within the drift region from the junction with the highest value right at the P-N junction. The area under the electric field curve is the maximum voltage that this region can support (i.e., the breakdown voltage). In order to increase the breakdown voltage of the prior art design, it is necessary to decrease doping in the drift region and increase the length of this region. These changes will result in a longer triangle and an increase in the area under the electric field line, which increases the breakdown voltage of the region. However, increasing the size of the device is not always practical nor desirable. Further, the implication of this approach is that the desired breakdown voltage determines the required drift layer doping and width, which in turn increases device losses and decreases the power handling ability of the device.

Figure 18:
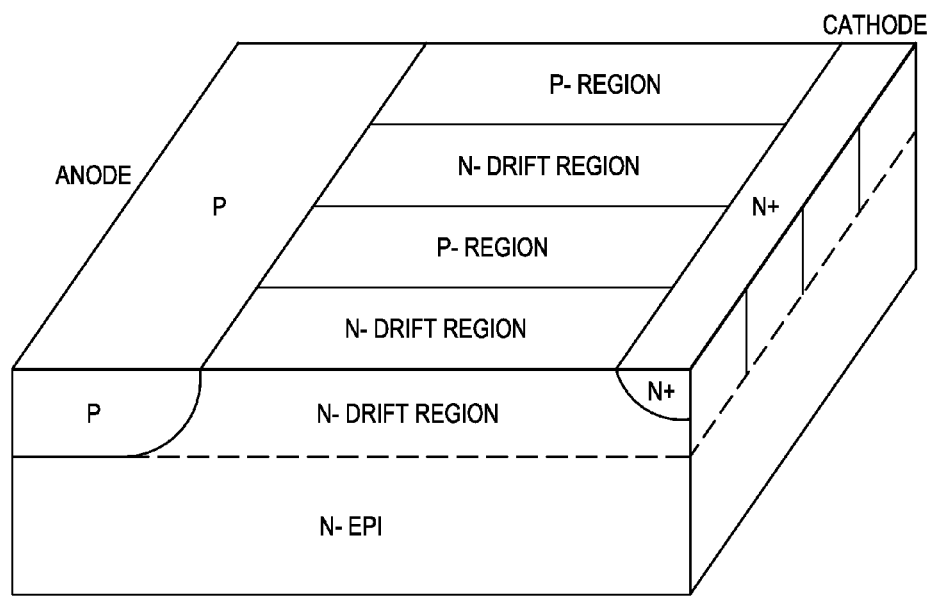
FIG. 18 illustrates a prior art p-n junction diode utilizing a super-junction drift region and FIG. 19 shows the peak electric field within the drift region of the diode.
Figure 19:
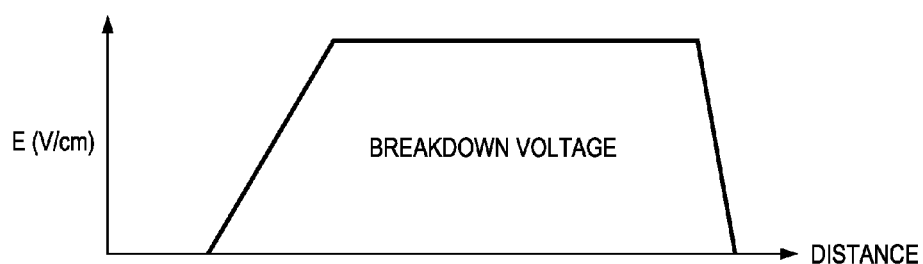

One recent method of addressing some of these issues is the so-called super-junction shown in FIG. 18. In this design, regions of opposing conductivity (labeled "P-region") surround a drift region. The doping of the opposing conductivity regions is designed to maintain a high electric field inside the drift region. As shown in FIG. 19, the electric field is maintained along the length of the drift region and the resulting breakdown voltage, which is the rectangular area under the curve, is greatly increased. The other benefit to this design is that the design can use higher doping in the drift region and the voltage rating can be increased by widening the drift region rather than lengthening it. The increased doping and shorter drift region decrease both resistive and switching losses.

Figure 20:
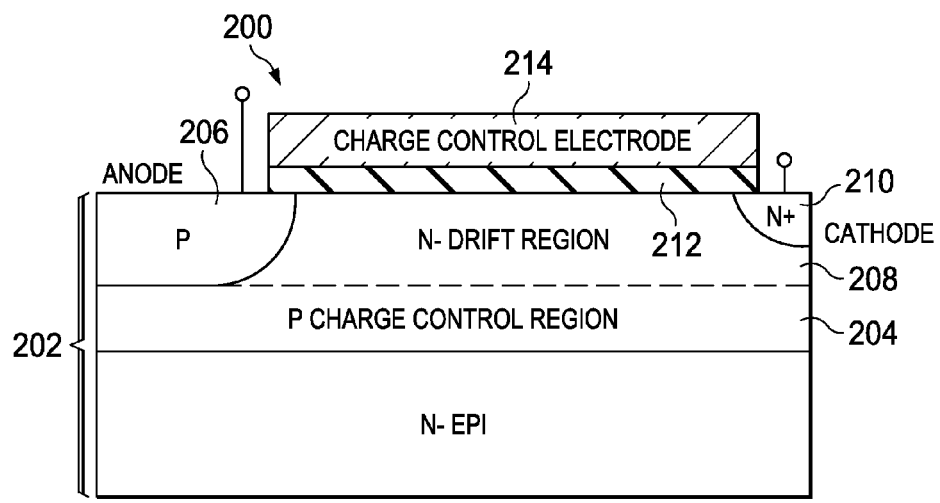
FIG. 20 illustrates a charge balanced p-n junction diode according to an embodiment of the present invention and FIG. 21 shows the peak electric field within the drift region of the diode.

FIG. 20 illustrates the charge balance design implemented in a P-N diode 200. As with the LDMOS devices described above, it should be understood that FIG. 20 illustrates a cross-sectional view of only a portion of a device region. The device is illustrated as being formed in and on a semiconductor layer, which in the illustrated embodiment includes an epitaxial layer 202, but it should be understood that, as with the LDMOS devices described above, the epitaxial layer 202 can be formed on a heavily doped N+ or P+ substrate as appropriate. The device can also be formed over a buried oxide layer, such as in a silicon-on-insulator device, or as a part of an integrated circuit (IC) isolated from the rest of the circuitry using industry standard methods of junction isolation, shallow trench isolation, oxide isolation or other well known methods.

The P-N diode 200 includes a P-doped implant region 206, which forms an anode of the diode 200 and a N+ doped implant region 210, which forms a cathode of the diode 200. The anode and cathode are spaced from one another by a lightly doped N-drift region 208. As described above in connection with, for example, the buffer region 21 of the LDMOS transistor 10D of FIG. 11, a charge control region 204 in the form of a P-doped implant is formed in the epitaxial layer 202 underlying the lightly doped drift region 208. A conductive charge control electrode 214, for example, a metal or doped polysilicon layer, is formed over a portion of the P-doped cathode implant region 206, the drift region 208 and a portion of the N+ anode implant region 210. The charge control electrode 214 is spaced from the upper surface of the epitaxial layer 202 by an insulator layer 212. In embodiments, layer 212 can be formed from $SiO_2$. There is no requirement for the length of the overlap of the charge control electrode and the drift region 208, but the portion of the drift region 208 desired to be charge balanced should be overlapped.

Figure 21:
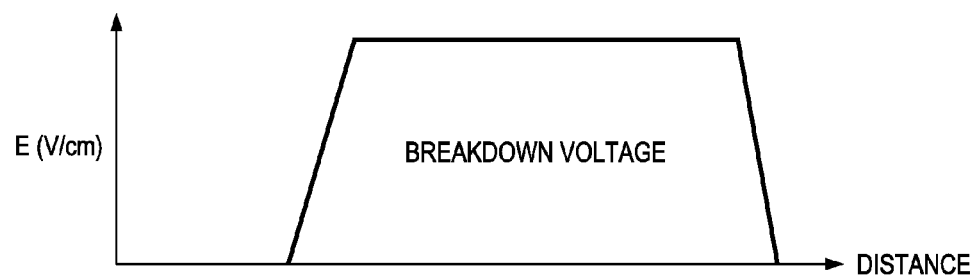

The junction design shown in FIG. 20 utilizes the oppositely doped layer 204 on the bottom side of the drift region 208 and the capacitive coupling of the electrode 214 through insulating layer 212 on the top side of the drift region 208 to maintain the electric field in the voltage supporting layer (i.e., in the drift region 208), as shown in FIG. 21. This design is particularly easy to implement with lateral devices such a shown in FIG. 20 as the doping of the underlying charge control region 204 and the thickness of the insulator 210 are readily controllable. In embodiments, the insulator 210 is $SiO_2$. When compared to super-junction designs shown in FIG. 18, where parts of the drift layer are consumed by regions of opposing conductivity, the entire drift region 208 can conduct current, thereby lowering resistive losses and providing improved power handling capability. The top charge of the isolated electrode 214 can be controlled mainly through the effective oxide thickness of the insulator layer 212 and the electrode potential. In contrast, with prior art super-junction devices, the inter-diffusion of layers and the ability to provide precise dose control determines the maximum charge that can be balanced. This in effect limits the maximum drift layer doping, the blocking voltage and resistance improvements when compared to more traditional devices.

As discussed above, the charge control electrode 214, drift region 208 and charge control implant region 204 are substantially charge balanced. For drift region 208, charge balancing means that the net doping multiplied by the thickness of the layer 208, which in effect is the number of net charge across the drift region, is balanced with the top and bottom regions. For a non-doped region, such as the electrode 204, the electrode forms a capacitor with the insulator layer 212 and the capacitor charge is set through selection of the oxide thickness to be closely or equally balanced with the drift region 208.

Computer simulations of the design have shown that a proper thickness for the insulator layer 212 and doping for the charge control region 204 can be chosen to maximize the breakdown voltage for a given doping and thickness of the drift layer 208. Variations from charge balance due to changes in the net doping of charge control region 204 and changes to the top electrode charge will reduce the breakdown voltage. When attempting to charge balance a more heavily doped drift layer, the charge balance sensitivity increases. With the prior art super-junction device of FIG. 18, it has been shown that $2e^{12}$ atoms/cm$^3$ charge is recommended for the drift region to provide reasonable breakdown voltage variation sensitivity in a typical manufacturing process. Any doping that is higher than this concentration results in greater breakdown sensitivity to charge variations. A lower dopant concentration than this optimal value is easier to charge balance but will not result in optimum on-resistance. In the charge balance design described above, due to the combined use of the charge control electrode 212 and ability to precisely control the thickness of the insulator layer 212, the doping of the drift region 208 can be further increased past that of prior art designs. This advancement improves device power handling capability and decreases resistive losses in the device. In embodiments, the net doping is at least about $2e^{12}$ atoms/cm$^3$, and more preferably at least about $5e^{15}$ atoms/cm$^3$, and still more preferably at least about $2e^{17}$ atoms/cm$^3$, for a drift region having a length between about 0.2 and 100 μm.

The charge control electrode 214 can be connected to the lower voltage node of the applied bias or to any voltage between the applied voltage and ground. If the electrode 214 is not coupled to ground, the oxide thickness can be further adjusted to maintain charge balance. Design calculations familiar to those in the art can be used to determine the correct oxide thickness for the maximum electrode voltage.

Figure 22:
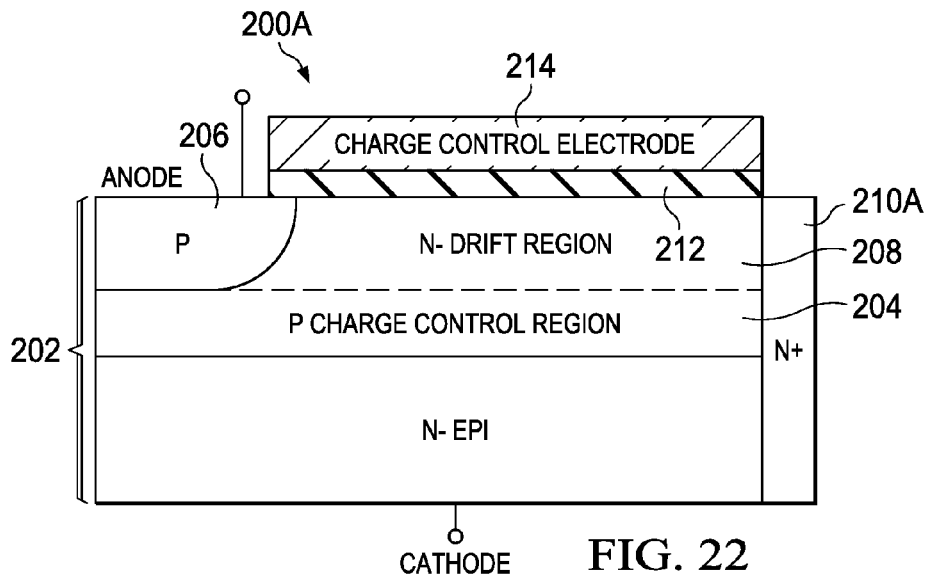
FIGS. 22-23 illustrate alternative embodiments of the diode of FIG. 21.

FIG. 22 illustrates an alternative embodiment 200A of the P-N diode described above in connection with FIG. 20. In this embodiment, the N+ implant region 210A extends through the epitaxial layer 202 to a bottom surface of the epitaxial layer so as to allow for backside electrical contact to a bottom electrode, such as in the form of an N+ substrate 12 and/or electrode 11 as described above in detail in connection with, for example, LDMOS 10D of FIG. 11. This N+ region 210A can be formed, for example, in the manner described above in connection with the device of FIG. 1-4 or 11-13 and may, but need not be, recessed or spaced from the upper surface of the epitaxial layer 202.

Figure 23:
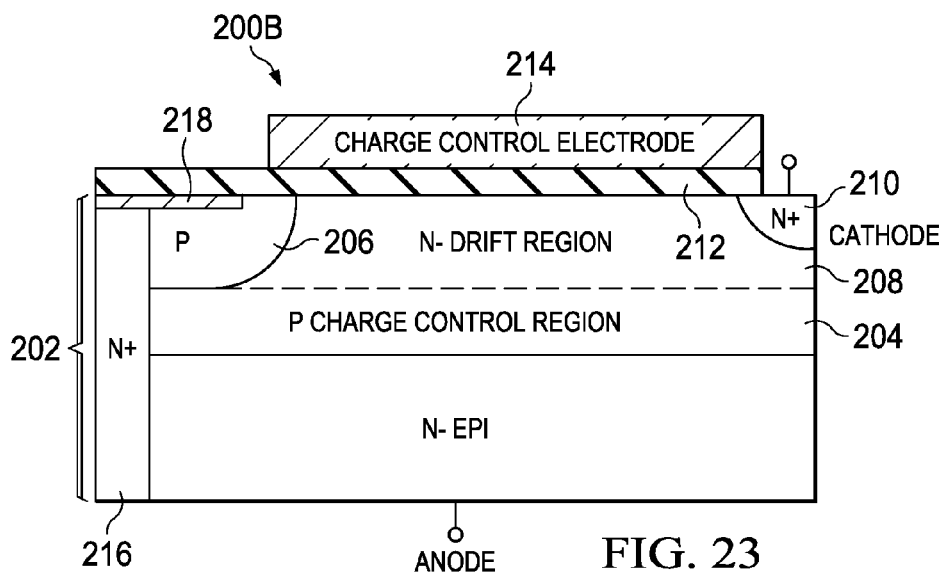

FIG. 23 illustrates another alternative 200B similar in design to devices 200 and 200A but configured for backside anode contact. In this embodiment, a N+ implant region 216, similar in structure to implant region 210A of FIG. 22, is formed through the epitaxial layer 202 to conduct current with a backside of the device 200B, such as with an N+ doped substrate and/or backside electrode described above. A conductive silicide region is formed at an upper surface of the epitaxial layer 218 to join the N+ doped region 216 with the P-doped layer 206 so as to avoid creating an additional p-n junction. This metal layer can be continuous or applied only to small area as needed.

Figure 24:
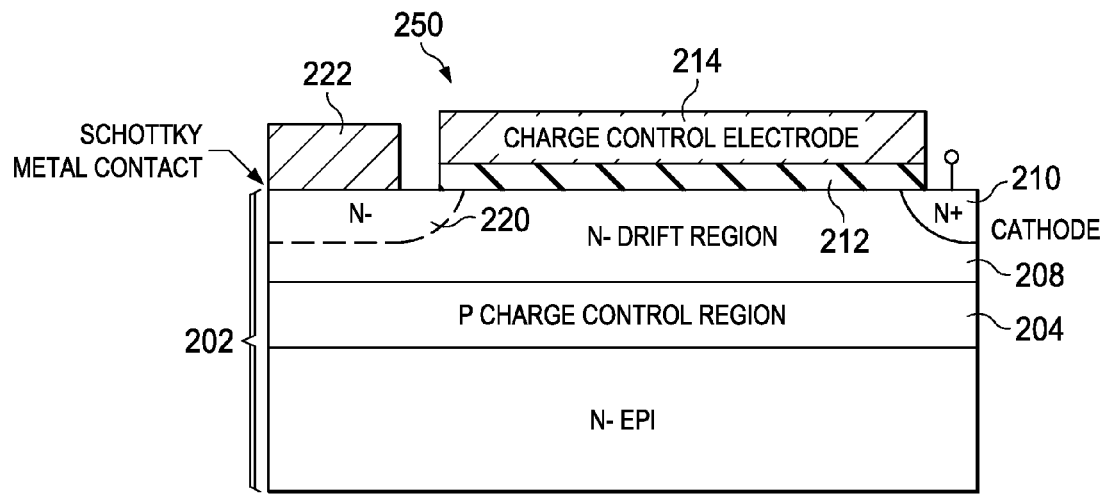
FIG. 24 illustrates an embodiment of a charge balanced p-n Schottky diode according to an embodiment of the present invention.

FIG. 24 illustrates an embodiment of a P-N Schottky diode 250 having charge balance as described above. In this embodiment, the P-implant region 206 is replaced by a continuation of the drift region 208 and a very lightly doped implant region 220 proximate the upper surface of the epitaxial layer 202. A metal layer 222 is formed on the upper surface of the epitaxial layer in contact with the very lightly doped N-- region 220, forming a Schottky metal contact at their interface.

Figure 25:
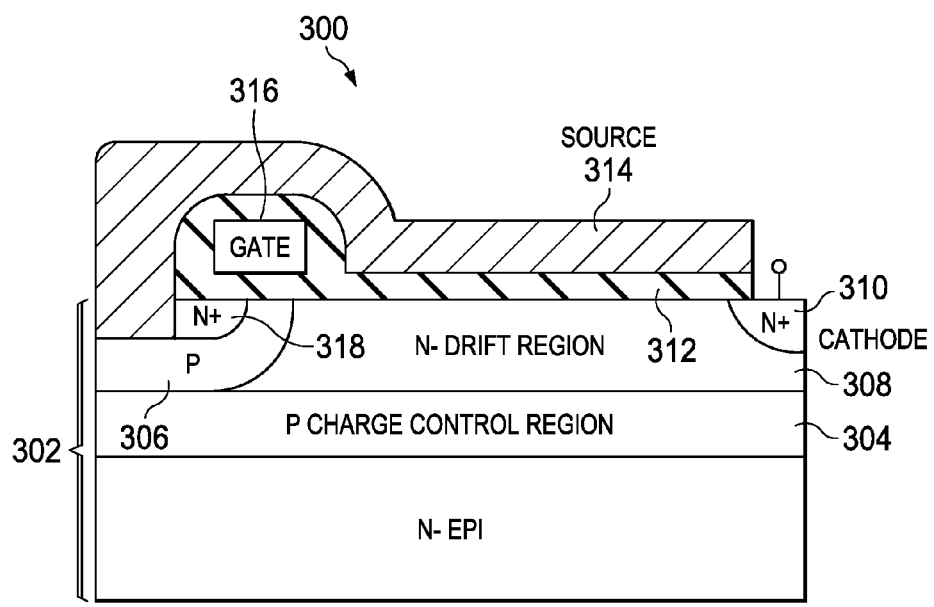
FIG. 25 illustrates a charge balanced LDMOS device according to an embodiment of the present invention.

FIG. 25 illustrates an embodiment where the charge balance design is implemented in an LDMOS transistor 300 formed in and on a semiconductor layer including an epitaxial layer 302. As described in connection with the LDMOS and diode devices referenced above, the LDMOS transistor 300 includes a P-doped charge control region 304 implanted in the epitaxial layer 302 underlying the lightly doped drift region 308 and the P-doped body region 306, which forms a channel underlying the control gate 316. The transistor 300 includes an N+ doped source region 318 and an N+ doped drain region 310. In this embodiment, a source electrode 314 contacts the source implant region 318 and shorts that region to the body region 306. The source electrode extends over the gate and is insulated therefrom by insulator layer 312. Insulator layer 312 spaces the source electrode 314 from the upper surface of the epitaxial layer 302 in the area of the drift region 308. Again, charge balance is designed into the device 300 between the P-doped charge control implant region 304, the N-doped drift region 308 and the source electrode 314, which serves as the charge control electrode, through the doping and size of the layers 304 and 308 and the thickness of the insulator layer 212 and/or the potential of the source electrode 314.

Figure 26:
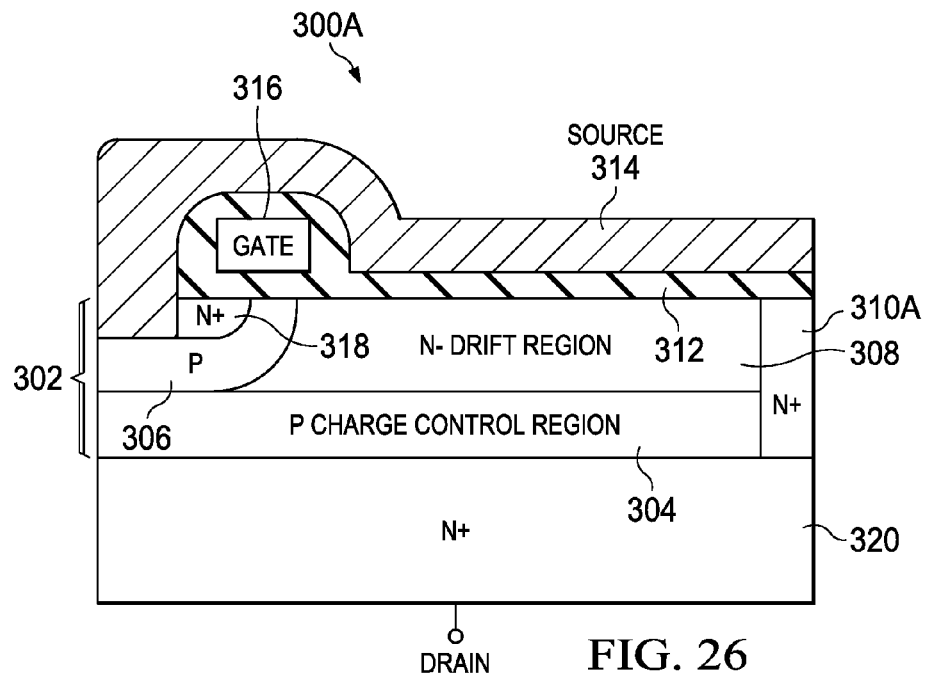
FIGS. 26, 27, 29-31, and 34 illustrate alternate embodiments of the charge balanced LDMOS device of FIG. 25.

FIG. 26 illustrates an alternative embodiment of an LDMOS transistor 300A. Transistor 300A is identical to transistor 300 except that, as described above in connection with the LDMOS transistors of FIGS. 1-4 and 11-13, current flows both laterally and vertically through the device. These kinds of devices are sometimes referred to herein as quasi- or semi-lateral devices. The epitaxial layer 302 is shown formed over a highly doped N+ substrate 320. The drain contact 310A extends through the epitaxial layer 302 to couple the device current to the conductive substrate 320, which can be coupled to a drain electrode (not shown) at the bottom of the device as described above or which itself may serve as the drain electrode. The advantage of a semi-lateral design as shown in FIG. 26 is that it allows the device to drop voltage both laterally and vertically, resulting in the ability to design an even smaller drift layer and overall device size.

Figure 27:
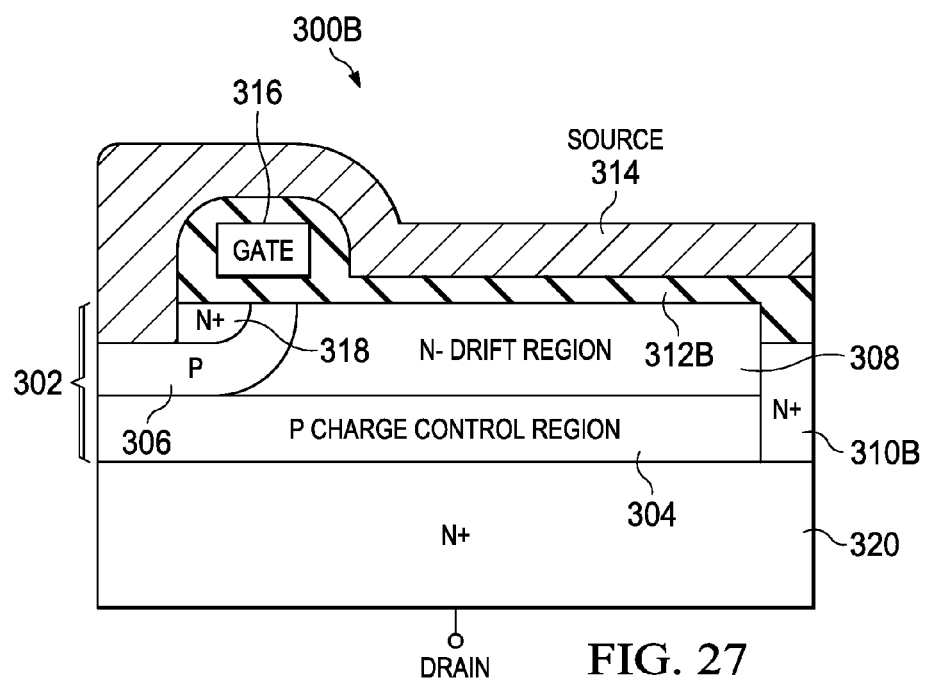

FIG. 27 illustrates an embodiment of an LDMOS transistor 300B, which is identical to the device of FIG. 26 only with drain implant region 310B spaced from the upper surface of the epitaxial layer 302 in the manner shown in, for example, FIGS. 12 and 13. Insulator layer 312B fills the recess formed in the epitaxial layer 302 over the implant region 310B. The benefit of this design is that in effect it extends the surface length, which reduces the surface fields.

Figure 28:
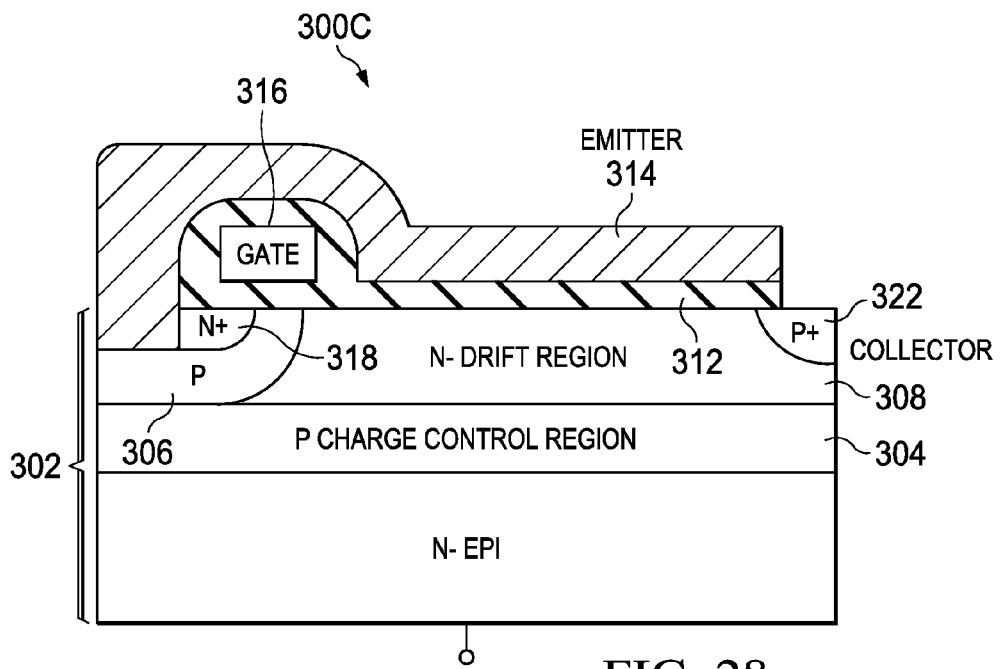
FIG. 28 illustrates an embodiment of a charge balanced IGBT device.

The device 300C of FIG. 28 is similar to the device 300 of FIG. 25 except that N+ implant region 310 is replaced with P+ implant region 322, making device 300C a charge balanced lateral IGBT (insulated-gate bipolar transistor). Though the charge control electrode 314 is shown partially overlapping the P+ collector region 322, this is not a requirement; The electrode 314 could completely overlap, partially overlap or not overlap this region.

Figure 29:
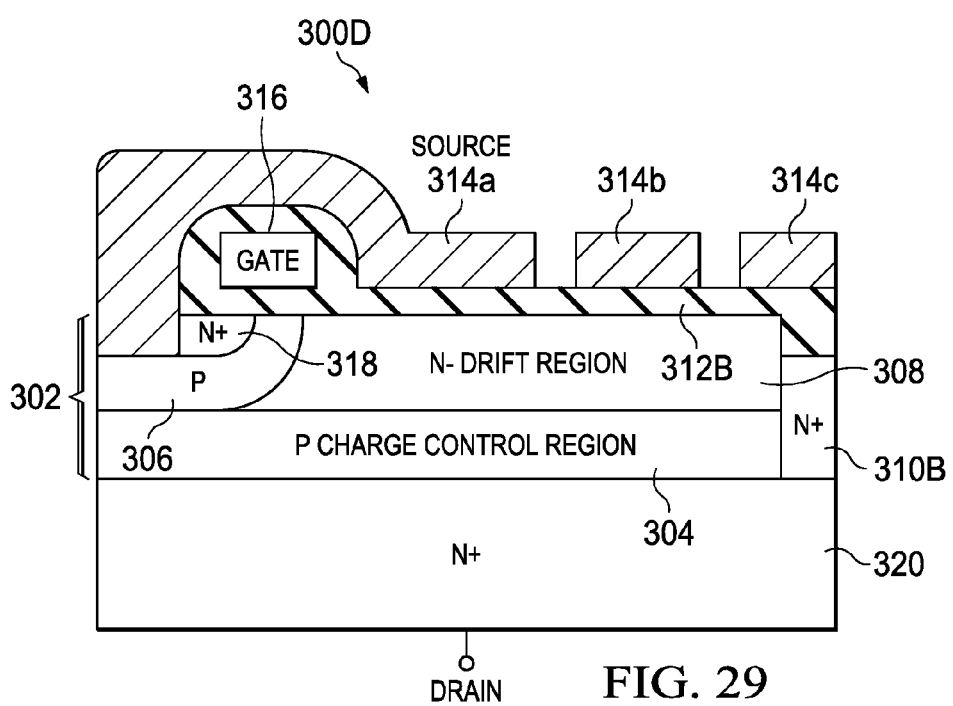

The device 300D of FIG. 29 is identical to the device 300B shown in FIG. 27 only source electrode 314, which serves as the charge control electrode, is provided as multiple (e.g., at least two) charge control electrodes 314a, 314b and 314c. This feature is particularly applicable to high voltage devices, where in order to maintain the charge balance the oxide thickness can be segmented or the electrode segmented and separately biased, or both. In the embodiment of FIG. 29, the potential on the electrodes increases from the electrode(s) formed over the gate to those formed more proximate to the drain contact.

Figure 30:
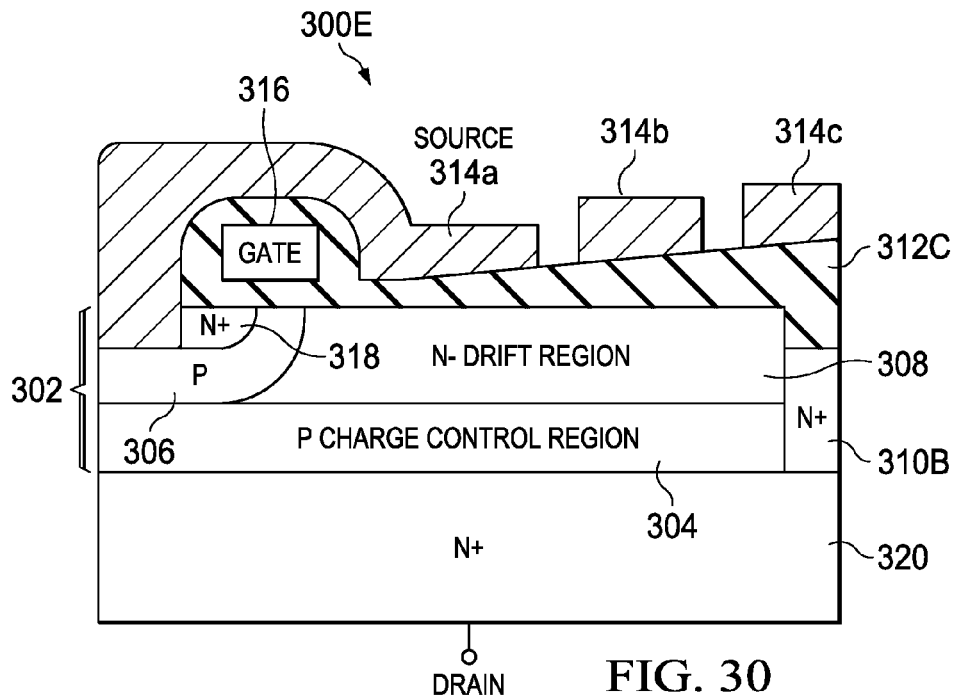

The device 300E of FIG. 30 is identical to the device 300D of FIG. 30 only it contains modified insulator layer 312C. Insulator layer 312C has a region of increased thickness (when defined from the upper surface of the epitaxial layer 302) more proximate to the highly doped drain implant region 310B. A similar feature is shown in, for example, FIGS. 2-4 described above. In the embodiment illustrated in FIG. 30, the insulator layer has a sloped upper surface but the insulator layer could take on other shapes, such as the stepped shape shown in FIGS. 2-4. Considerations for this embodiment are discussed above in connection with FIGS. 2, 27 and 29.

Figure 31:
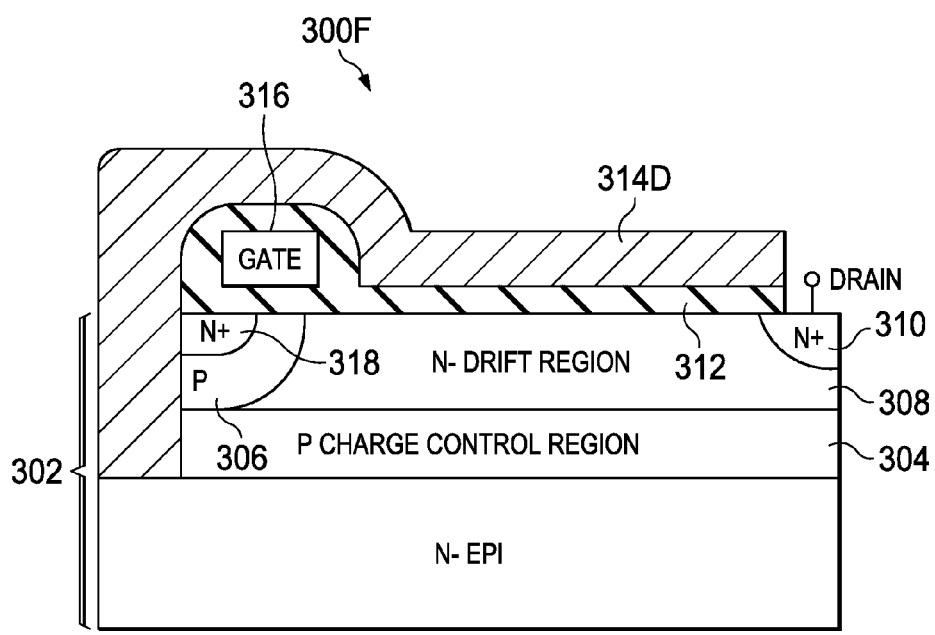

The device 300F of FIG. 31 is similar to the device 300 of FIG. 25 only modified source electrode 314D extends only partially through the epitaxial layer 302, i.e., through body region 306 and P charge control region 304. In this embodiment, both source and drain electrodes are formed over the upper surface of the device.

Although the charge balance design is described above in connection with lateral diode devices, MOS-gated transistor devices, and IGBT devices, it is also applicable to bipolar transistors Further, although shown in connection with lateral and semi-lateral devices, the charge balance design can also be applied to purely vertical devices.

Figure 32:
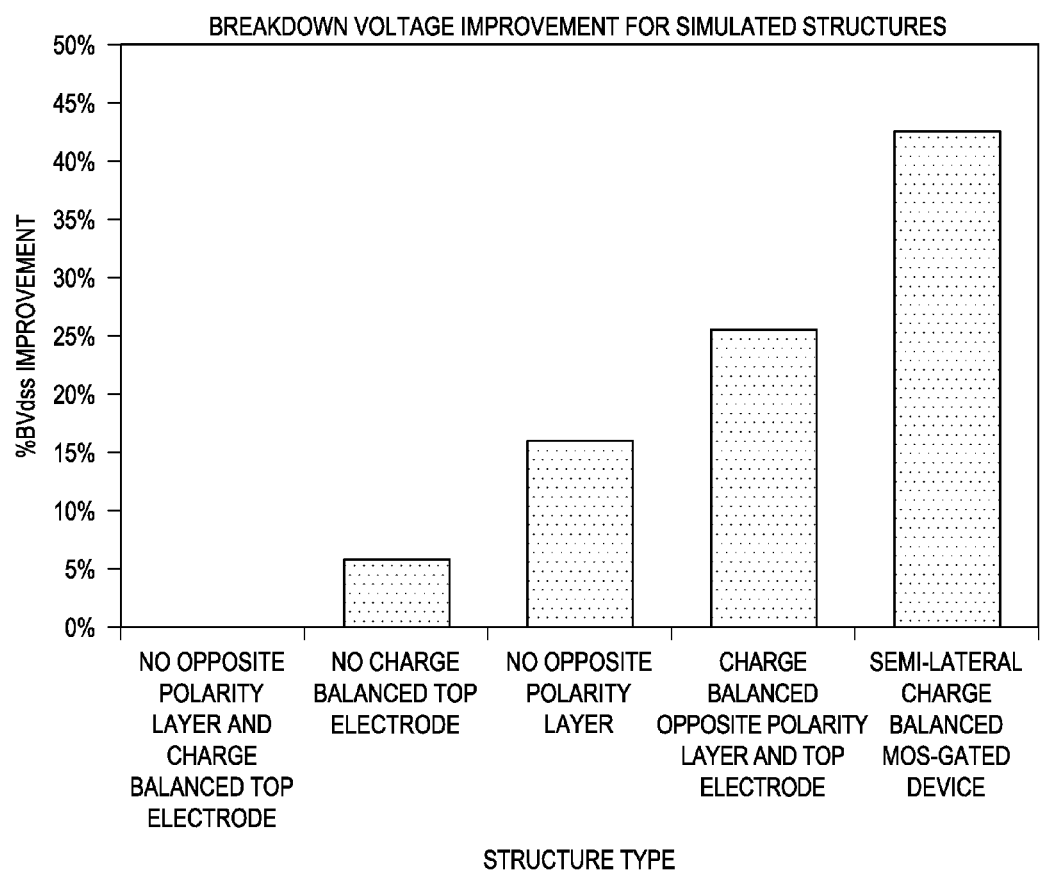
FIG. 32 shows a graph illustrating relative percentage improvement in the breakdown voltage of various devices.
Figure 33:
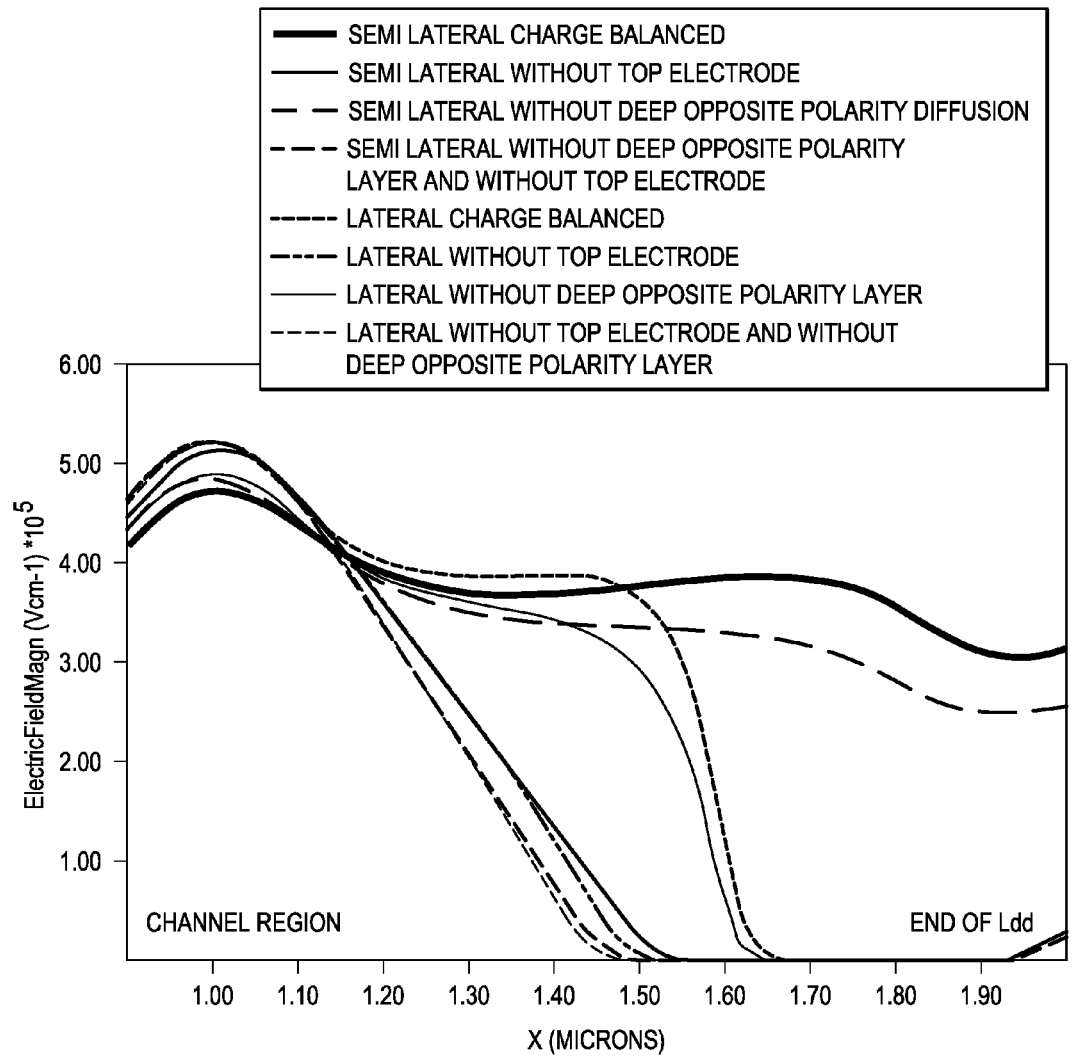
FIG. 33 shows a graph illustrating the peak electric field across the drift region of various devices.

FIGS. 32 and 33 contain charts that show the results collected from various computer simulations of 20-30V MOS-FET devices described above. The best results were realized with a semi-lateral charge balance device, such as shown in, for example, FIG. 26. FIG. 32 shows the percentage breakdown voltage (% BVdss) improvement for simulations of various structures. As shown in FIG. 32, the base-line device (i.e., 0% improvement) is a lateral device having no charge balancing in the oppositely doped charge control implant region or a charge balanced top electrode. A lateral device having a charge balanced oppositely doped charge control implant region but no charge balanced top electrode exhibited a breakdown voltage improvement of about 5%. A lateral device having no charge balanced oppositely doped charge control implant region but having a charge balanced top electrode exhibited a breakdown voltage improvement of about 15%. A lateral device having both a charge balanced oppositely doped charge control implant region and charge balanced top electrode exhibited a significant breakdown voltage improvement of about 25%. Finally, a semi-lateral device having both a charge balanced oppositely doped charge control implant region and charge balanced top electrode exhibited a significant breakdown voltage improvement just under 44%.

FIG. 33 shows cross-sectional electric field distributions in the drift layer of various lateral MOS-gated devices. Since the voltage that the device can support is the area under the electric field curve, it can be seen that the semi-lateral MOS gated structure with a charge balanced top electrode and an opposite polarity region offers the most significant improvements.

Applying the foregoing principles, a charge balanced 20V device conforms to the following parameters: a Ldd region having a length of 0.7 µm and a doping concentration of $2e^{17}$ atoms/cm$^3$; effective oxide thickness of 1000 Å; charge control layer of similar doping concentration as the Ldd region. In order to improve the avalanche breakdown performance, the doping concentration of the charge control layer can be increased, or the doping concentration of the drift region can be decreased, or both. A 30 V breakdown voltage device would have a Ldd region length of about 1 µm.

The charge balanced devices described herein preferably have optimized (i.e., substantially balanced) charge levels, via their dopant concentrations, spacing, and other characteristics described herein, within 10% or less of each other.

Figure 34:
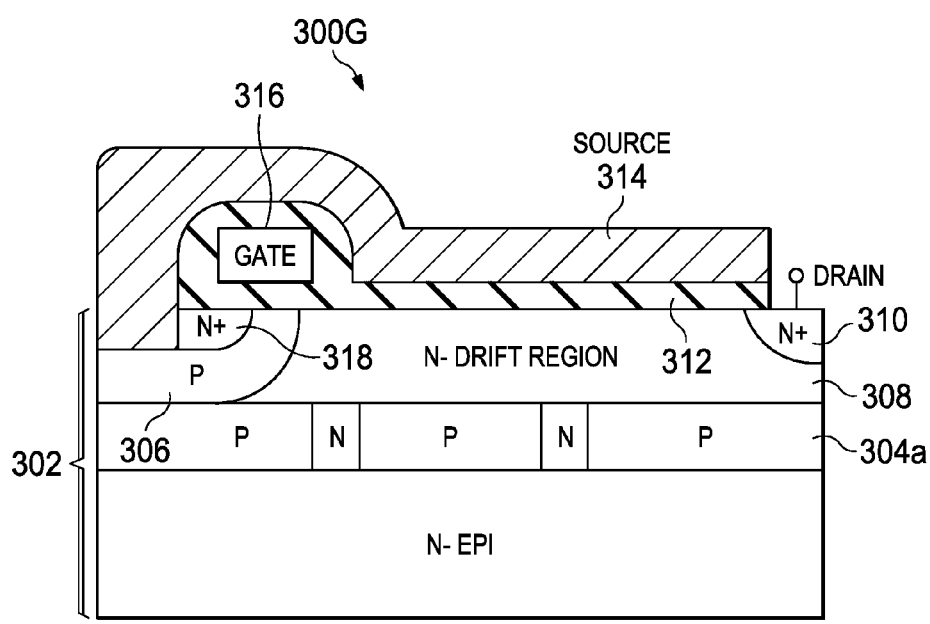

Although the drift regions have been shown in FIGS. 20-31 as uniformly doped regions, in embodiments the region can also comprise various doping segments having isolated islands of doping. In this embodiment, illustrated by LDMOS transistor 300G in FIG. 34, specifically by modified charge balance layer 304a, charge balance extends through the layers with no balance where the breakdown voltage will deteriorate like in a traditional device. This embodiment should reduce reverse body diode recovery (Qrr) since the body diode is fragmented and most of the doping islands are floating and not contributing significantly to the Qrr. Charge balance can still be accomplished with this type of drift region by providing a dielectric layer of varying thickness for the top electrode and varying the doping for the opposing polarity charge control implant layer.

Further, in embodiments it is preferred that the entire drift region is substantially charge balanced as described above, it is contemplated that parts of the drift region may be charge balanced. For example, in embodiments, one or both ends of the drift region may not be charge balanced, or the center region may not be charge balanced while the ends regions are.

Still further, although the charge balance devices are shown as n-channel devices, this is for purposes of illustration only. The concepts described herein apply equally to p-channel devices. Further, various devices are shown having a heavily doped N+ substrate, but a P+ substrate can also be used. If a P+ substrate is used, a conductive metal or compound, such as a silicide, can be used to join an N-doped component, such as the source of a LDMOS device, to the P-doped charge control layer without creating a p-n junction. This metal can be continuous or just applied only to small area of p and n side.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A semiconductor device, comprising:
   a semiconductor layer having lower and upper surfaces;
   a first contact formed in or on said semiconductor layer;
   a second contact comprising:
      a vertical drain contact region of a first conductivity type formed in said semiconductor layer proximate the upper surface thereof and spaced from said first contact by an enhanced drain drift region of said first conductivity type formed in said semiconductor layer;
   a charge control implant region of a second conductivity type formed in said semiconductor layer under said enhanced drain drift region;
   an insulator layer formed over said semiconductor layer; and
   a charge control electrode formed over said insulator layer and spaced from the upper surface of said semiconductor layer by said insulator layer, the charge control electrode extending laterally over substantially all of said enhanced drain drift region, wherein a net charge across at least a portion of the enhanced drain drift region is substantially charge balanced with the charge control implant region and the charge control electrode, and wherein a conduction current is conveyed through a resistance path through the vertical drain contact region.

2. The semiconductor device of claim 1, wherein the enhanced drain drift region, charge control implant region and charge control electrode are substantially charge balanced when said device is in operation, thereby maintaining a high electric field produced during operation along said drift region.

3. The semiconductor device of claim 1, wherein a doping profile of the enhanced drain drift region, a doping profile of the charge control implant region and a thickness of the insulator layer are set to provide charge balancing.

4. The semiconductor device of claim 1, wherein said second contact is coupled through said semiconductor layer to a highly doped substrate at the lower surface of said semiconductor layer.

5. The semiconductor device of claim 1, wherein said semiconductor device is a laterally diffused metal-oxide-semiconductor transistor.

6. The semiconductor device of claim 5,
wherein said first and second contacts comprise source and drain implant regions of the first conductivity type, respectively;
wherein said semiconductor layer comprises a body region of a second conductivity type formed in said semiconductor layer, said body region forming a channel region between said source implant region and said enhanced drain drift region and extending under said source implant region;
wherein said semiconductor device comprises a gate formed over said channel region and a source electrode coupled to the source implant region and body region; and
wherein said source electrode extends over said insulator layer to form at least a part of said charge control electrode.

7. The semiconductor device of claim 6, wherein said drain implant region is coupled through said semiconductor layer to a highly doped substrate at the lower surface of said semiconductor layer.

8. The semiconductor device of claim 6, wherein said device includes a plurality of charge control electrodes, at least one of which includes said source electrode.

9. The semiconductor device of claim 6, wherein said insulator layer includes a region of increased thickness proximate to said drain implant region.

10. The semiconductor device of claim 6, wherein said second contact is coupled through said semiconductor layer to a highly doped substrate at the lower surface of said semiconductor layer.

11. The semiconductor device of claim 1, wherein said device includes a plurality of charge control electrodes capacitively coupled to said drift region.

12. A semiconductor device, comprising:
a semiconductor layer having lower and upper surfaces;
a first contact formed in or on said semiconductor layer;
a second contact comprising an implant region of a first conductivity type formed in said semiconductor layer proximate the upper surface thereof and spaced from said first contact by a drift region of said first conductivity type formed in said semiconductor layer;
a charge control implant region of a second conductivity type formed in said semiconductor layer under said drift region;
an insulator layer formed over said semiconductor layer; and
a charge control electrode formed over said insulator layer and spaced from the upper surface of said semiconductor layer by said insulator layer;
wherein a net charge across at least a portion of the drift region is substantially charge balanced with the charge control implant region and charge control electrode;
wherein said first and second contacts comprise source and drain implant regions of the first conductivity type, respectively;
wherein said semiconductor layer comprises a body region of a second conductivity type formed in said semiconductor layer, said body region forming a channel region between said source implant region and said drift region and extending under said source implant region;
wherein said semiconductor device comprises a gate formed over said channel region and a source electrode coupled to the source implant region and body region; and
wherein said source electrode extends over said insulator layer to form at least a part of said charge control electrode;
wherein said drain implant region is coupled through said semiconductor layer to a highly doped substrate at the lower surface of said semiconductor layer; and
wherein said drain implant region comprises a highly doped drain implant region having a topmost portion spaced from said upper surface of said semiconductor layer.

13. The semiconductor device of claim 12, wherein the drift region, charge control implant region and charge control electrode are substantially charge balanced when said device is in operation, thereby maintaining a high electric field produced during operation along said drift region.

14. The semiconductor device of claim 12, wherein a doping profile of the drift region, a doping profile of the charge control implant region and a thickness of the insulator layer are set to provide charge balancing.

15. The semiconductor device of claim 12, wherein said device includes a plurality of charge control electrodes, at least one of which includes said source electrode.

16. The semiconductor device of claim 12, wherein said insulator layer includes a region of increased thickness proximate to said drain implant region.

17. The semiconductor device of claim 12, wherein said device includes a plurality of charge control electrodes capacitively coupled to said drift region.

18. A semiconductor device comprising:
a semiconductor layer having lower and upper surfaces;
a first contact comprising a first implant region of a first conductivity type formed in said semiconductor layer proximate the upper surface thereof;
a second contact comprising
a vertical drain contact region of the first conductivity type formed in said semiconductor layer proximate the upper surface thereof and spaced from said first implant region by an enhanced drain drift region of the first conductivity type formed in said semiconductor layer;
a charge control implant region of a second conductivity type formed in said semiconductor layer under and in contact with said enhanced drain drift region;
an insulator layer formed over said semiconductor layer; and a charge control electrode formed over said insulator layer and capacitively coupled to said enhanced drain drift region through said insulator layer, the charge control electrode extending laterally over substantially all of said enhanced drain drift region;

wherein a net charge across the enhanced drain drift region is substantially charge balanced with the charge control electrode; and wherein said charge control implant region is doped to a level beyond that which would substantially charge balance said charge control implant region with the net charge across the enhanced drain drift region, thereby providing improved avalanche breakdown performance, wherein a conduction current is conveyed through a resistance path through the vertical drain contact region.

19. The semiconductor device of claim 18, wherein said semiconductor device is an LDMOS transistor.

20. The semiconductor device of claim 19, wherein the enhanced drain drift region is doped to a concentration of at least $2e^{17}$ atoms/cm$^3$.

21. A semiconductor device comprising:
a semiconductor layer having lower and upper surfaces;
a first contact comprising a first implant region of a first conductivity type formed in said semiconductor layer proximate the upper surface thereof;
a second contact comprising:
a vertical drain contact region of the first conductivity type formed in said semiconductor layer proximate the upper surface thereof and spaced from said first implant region by an enhanced drain drift region of the first conductivity type formed in said semiconductor layer;
a charge control implant region of a second conductivity type formed in said semiconductor layer under and in contact with said enhanced drain drift region;
an insulator layer formed over said semiconductor layer; and
a charge control electrode formed over said insulator layer and capacitively coupled to said enhanced drain drift region through said insulator layer, the charge control electrode extending laterally over substantially all of said enhanced drain drift region, wherein a net charge across the drift region is substantially charge balanced with the charge control implant region and the charge control electrode, and wherein a conduction current is conveyed through a resistance path through the vertical drain contact region.

22. The semiconductor device of claim 21, wherein the enhanced drain drift region is doped to a concentration of at least $5e^{15}$ atoms/cm$^3$.

23. The semiconductor device of claim 22, wherein said semiconductor device is an LDMOS transistor.

24. The semiconductor device of claim 21, wherein the breakdown voltage of the device is at least 20 V.

* * * * *